(12) United States Patent
Chen et al.

(10) Patent No.: US 11,837,526 B2
(45) Date of Patent: Dec. 5, 2023

(54) SEMICONDUCTOR PACKAGE STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Yang-Che Chen, Hsin-Chu (TW); Chen-Hua Lin, Yunlin County (TW); Huang-Wen Tseng, Hsinchu County (TW); Victor Chiang Liang, Hsinchu (TW); Chwen-Ming Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 587 days.

(21) Appl. No.: 16/450,657

(22) Filed: Jun. 24, 2019

(65) Prior Publication Data

US 2020/0402892 A1 Dec. 24, 2020

(51) Int. Cl.
| | | |
|---|---|---|
| *H01L 23/48* | (2006.01) | |
| *H01L 27/06* | (2006.01) | |
| *H01L 25/065* | (2023.01) | |
| *H01L 21/768* | (2006.01) | |
| *H01L 23/31* | (2006.01) | |
| *H01L 21/56* | (2006.01) | |

(52) U.S. Cl.
CPC .......... *H01L 23/481* (2013.01); *H01L 21/566* (2013.01); *H01L 21/76816* (2013.01); *H01L 23/3157* (2013.01); *H01L 25/0657* (2013.01); *H01L 27/06* (2013.01)

(58) Field of Classification Search
CPC ............. H01L 23/481; H01L 23/49827; H01L 23/5383; H01L 23/5384; H01L 23/5385
See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |

(Continued)

FOREIGN PATENT DOCUMENTS

| | | | | |
|---|---|---|---|---|
| CN | 202523706 U | * | 11/2012 | ............. H01L 24/96 |

*Primary Examiner* — Michele Fan
(74) *Attorney, Agent, or Firm* — WPAT Law; Anthony King

(57) ABSTRACT

A semiconductor structure includes a molding compound having a first surface and a second surface opposite to the first surface, a passive device component disposed in the molding compound, a via penetrating the molding compound from the first surface to the second surface, a first connection structure disposed over the first surface of the molding compound and electrically coupled to the passive device component, and a second connection structure disposed over the second surface of the molding compound. The first connection structure and the second connection structure are electrically coupled to each other by the via.

20 Claims, 20 Drawing Sheets

(56) References Cited

U.S. PATENT DOCUMENTS

| | | | |
|---|---|---|---|
| 9,425,126 B2 | 8/2016 | Kuo et al. | |
| 9,443,783 B2 | 9/2016 | Lin et al. | |
| 9,496,189 B2 | 11/2016 | Yu et al. | |
| 2016/0343694 A1* | 11/2016 | Lin | H01L 21/78 |
| 2018/0226349 A1* | 8/2018 | Yu | H01L 21/565 |
| 2019/0006331 A1* | 1/2019 | Khalaf | H01L 25/50 |
| 2019/0131273 A1* | 5/2019 | Chen | H01L 25/0652 |
| 2019/0148276 A1* | 5/2019 | Chen | H01L 21/486 |
| | | | 257/774 |

* cited by examiner

SEMICONDUCTOR PACKAGE STRUCTURE AND METHOD FOR MANUFACTURING THE SAME

BACKGROUND

The semiconductor industry has experienced rapid growth, due in part to ongoing improvements in the integration density of a variety of electronic components (e.g., transistors, diodes, resistors, capacitors, etc.). For the most part, improvements in integration density have resulted from iterative reduction of minimum feature size, which allows more components to be integrated into a given area. As the demand for smaller electronic devices has increased, a need for more space-efficient and creative packaging techniques for semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
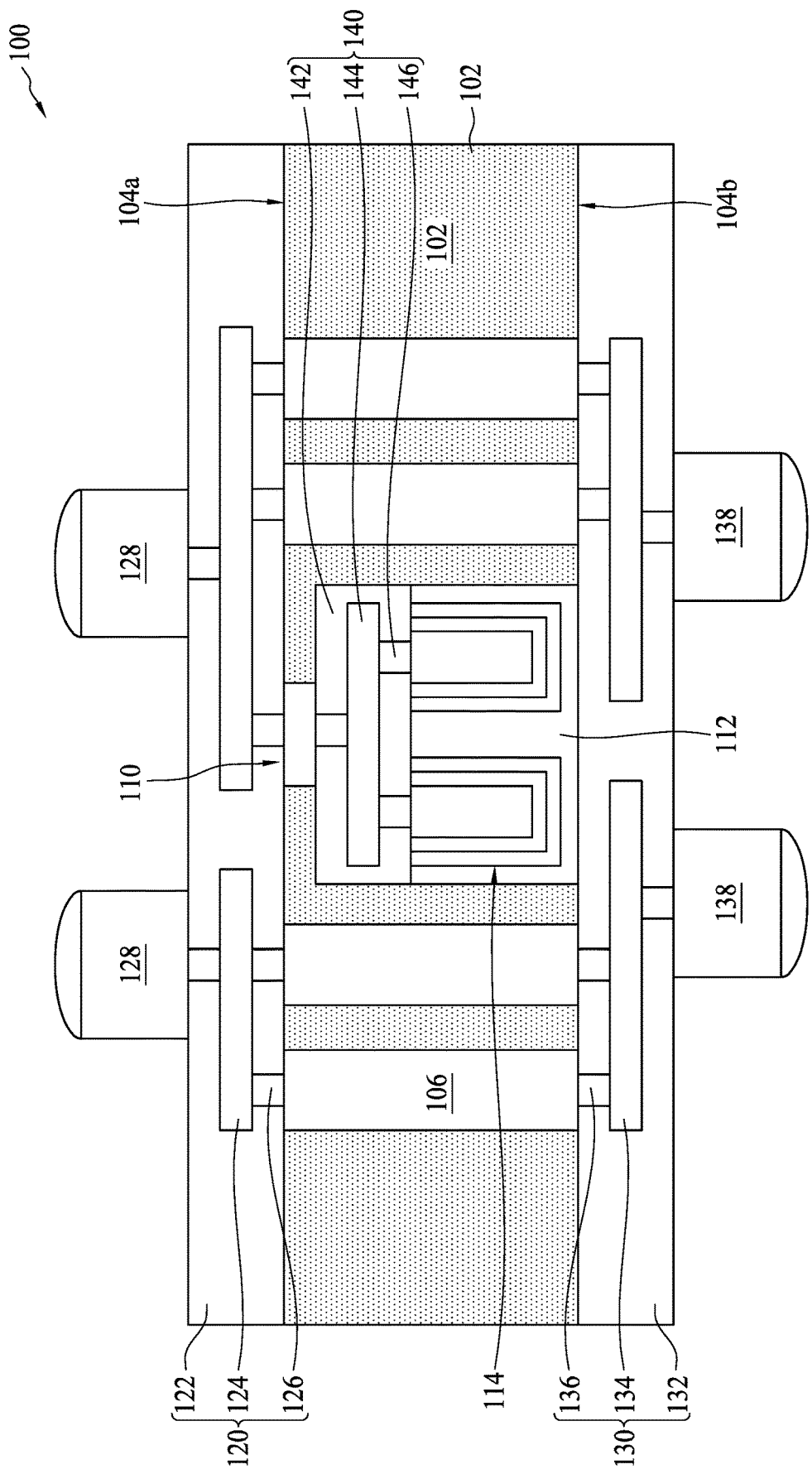
FIG. 1 is a schematic drawing illustrating a semiconductor package structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

One or more implementations of the present disclosure will now be described with reference to the attached drawings, wherein like reference numerals are used to refer to like elements throughout, and wherein the illustrated structures are not necessarily drawn to scale. As used herein, the terms "die" and "chip" are interchangeable throughout the specification.

The terms "wafer" and "substrate" used herein include any structure having an exposed surface onto which a layer is deposited according to the present invention, for example, to form a circuit structure such as a redistribution layer (RDL). The term "substrate" is understood to include semiconductor wafers, but is not limited thereto. The term "substrate" is also used to refer to semiconductor structures during processing, and may include other layers that have been fabricated thereupon.

Embodiments discussed herein may be discussed in a specific context, namely a semiconductor package structure including an integrated passive device (IPD) such as a resistor, inductor, capacitor, balun transformer, coupler, splitter, filter or diplexer, but the disclosure is not limited thereto. In some embodiments, the semiconductor package structure can include one or more IPDs. The semiconductor package structure can be a fan-out or fan-in package structure. Other embodiments contemplate other applications, such as different package types or different configurations that would be readily apparent to a person of ordinary skill in the art upon reading this disclosure.

As the demand for shrinking electronic devices has grown, a need for smaller and more creative packaging techniques of semiconductor dies has emerged. An example of such packaging systems is package-on-package (PoP) technology. In a PoP device, a top semiconductor package is stacked on top of a bottom semiconductor package to provide a high level of integration and component density. PoP technology generally enables production of semiconductor devices with enhanced functionalities and small footprints. In some comparative embodiments, an integrated passive device is fabricated in a semiconductor substrate with a through substrate via (TSV), which is also commonly referred to as a through-silicon via in the case of silicon substrates/wafers. TSVs are vertical electrical connections that extend the full thickness of the bulk silicon substrate from one side to another. The TSV serves as a connection structure for the passive device, and therefore the passive device can be integrated in a semiconductor package structure on both sides. The integrated passive device is referred to as a double-side integrated passive device (DS-IPD).

Although the TSV makes the integrated passive device a double-side IPD, it creates some issues. For example, the TSV induces stress in the double-side IPD. Further, the TSV is less compatible with deep-trench capacitor processes. Additionally, TSVs suffer from high cost and lower throughput because fabricating TSVs in a substrate is a complex process.

The embodiments of the present disclosure therefore provide a method for forming a semiconductor package structure to include a double-side IPD with a through molding via (TMV). Instead of forming a connection structure in a semiconductor-based material, the method provides operations for forming a connection structure in a polymer-based material, which is more compatible with various kinds of IPDs and various formation operations. Further, the stress issue can be mitigated, and the IPDs can be tested before the manufacturing operations are completed, thus improving process yield control.

FIG. 1 is a schematic drawing illustrating a semiconductor package structure in accordance with some embodiments of the present disclosure. The semiconductor package structure 100 includes a molding compound 102 having a first surface 104a and a second surface 104b opposite to the first surface 102a, a passive device component 110 disposed in and surrounded by the molding compound 102, a via 106 penetrating the molding compound 102 from the first surface 104a to the second surface 104b, a connection structure 120 disposed over the first surface 104a of the molding compound 102, and another connection structure 130 disposed over the second surface 104b of the molding compound 102. As shown in FIG. 1, the connection structures 120 and 130 are disposed over two opposite surfaces of the molding compound 102. Significantly, the connection structure 120 and the connection structure 130 are electrically coupled to each other through the via 106.

In some embodiments, the molding compound 102 can include a molding compound, epoxy, or a polymer, such as polybenzoxazole (PBO), polyimide (PI) or benzocyclobutene (BCB), but the disclosure is not limited thereto. In some embodiments, the via 106 includes a metal material such as copper (Cu), titanium (Ti), tungsten (W) or aluminum (Al), but the disclosure is not limited thereto. In some embodiments, the via 106 is referred to as a through-molding via (TMV), and a height of the via 106 is substantially equal to a thickness of the molding compound 102.

The connection structure 120 can include a dielectric layer 122, conductive layers 124 disposed in the dielectric layer 122 and vias 126 disposed in the dielectric layer 122. In some embodiments, the via 106 can be electrically coupled to the conductive layer 124 of the connection structure 120 through the via 126. Similarly, the connection structure 130 can include a dielectric layer 132, conductive layers 134 disposed in the dielectric layer 132 and vias 136 disposed in the dielectric layer 132. In some embodiments, the via 106 can be electrically coupled to the conductive layer 134 of the connection structure 130 through the via 136. In some embodiments, a diameter of the via 106 is greater than diameters of the via 126 and the via 136. In some embodiments, a height of the via 106 is greater than heights of the via 126 and the via 136. In some embodiments, the dielectric layers 122 and 132 can include low dielectric constant (low-k) dielectric material, such as PSG, BPSG, fluorinated silicate glass (FSG), silicon oxycarbide ($SiO_xC_y$), spin-on-glass, spin-on-polymers, silicon carbon material, compounds, thereof, composites thereof, combinations thereof, or the like. The conductive layers 124 and 134 and the vias 126 and 136 can include Cu, Cu alloy, other metal alloys, or combinations or multiple layers thereof.

In some embodiments, the semiconductor package structure 100 further includes a conductor 128 disposed over the connection structure 120 and electrically coupled to the connection structure 120. In some embodiments, the conductor 128 is electrically coupled to the connection structure 120 through a pad (not shown). In some embodiments, the semiconductor package structure 100 further includes a conductor 138 disposed over the connection structure 130 and electrically coupled to the connection structure 130. In some embodiments, the conductor 138 is electrically coupled to the connection structure 130 through a pad (not shown). In some embodiments, widths or diameters of the conductors 128 and 138 can be different from each other. In other embodiments, the widths or the diameters of the conductors 128 and 138 can be the same, as shown in FIG. 1. The conductors 128 and 138 can provide external connection for the semiconductor package structure 100. In some embodiments, the conductors 128 and 138 can be formed on a UBM, though not shown. In some embodiments the conductors 128 and 138 over two opposite sides of the molding compound 102 can be aligned with each other. In other embodiments, the conductors 128 and 138 over two opposite sides of the molding compound 102 can be offset from each other, as shown in FIG. 1. The conductors 128 and 138 may be BGA connectors, solder balls, metal pillars, controlled collapse chip connection (C4) bumps, micro bumps or electroless nickel-electroless palladium-immersion gold technique (ENEPIG) formed bumps, but the disclosure is not limited thereto. The conductors 128 and 138 may include a conductive material such as solder, copper (Cu), aluminum (Al), gold (Au), nickel (Ni), silver (Ag), palladium (Pd), tin (Sn), or a combination thereof, but the disclosure is not limited thereto.

In some embodiments, the passive device component 110 can include a semiconductor substrate 112 and a passive device 114 disposed in the semiconductor substrate 112. The semiconductor substrate 112 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, the semiconductor substrate 112 can include doped or undoped silicon, or can be an active layer of an SOI substrate. The passive device 114 may include a capacitor, resistor, inductor, the like, or a combination thereof. In some embodiments, a thickness of the passive device component 110 is less than a thickness of the molding compound 102, but the disclosure is not limited thereto. In some embodiments, the thickness of the passive device component 110 is between approximately 20 μm and approximately 30 μm, but the disclosure is not limited thereto.

In some embodiments, the semiconductor package structure 100 further includes a connection structure 140 disposed over the passive device component 110, as shown in FIG. 1. Significantly, the passive device component 110 is electrically coupled to the connection structure 120 through the connection structure 140. Further, the passive device component 110 can be electrically coupled to the connection structure 130 through the connection structure 120 and the via 106. The connection structure 140 can include a dielectric layer 142, conductive layers 144 disposed in the dielectric layer 142 and vias 146 disposed in the dielectric layer 142. In some embodiments, the via 146 can be electrically coupled to the passive device 114, as shown in FIG. 1. In some embodiments, the dielectric layer 142 can include low-k dielectric material, such as PSG, BPSG, FSG, $SiO_xC_y$, spin-on-glass, spin-on-polymers, silicon carbon material, compounds, thereof, composites thereof, combinations thereof, or the like. The conductive layer 144 and the via 146 can include Cu, Cu alloy, other metal alloys, or combinations or multiple layers thereof. Significantly, both of the passive device component 110 and the connection structure 140 are embedded in the molding compound 102. Consequently, both of the passive device component 110 and the third connection structure 140 are separated from the via 106 by the molding compound 102.

As shown in FIG. 1, in some embodiments, sidewalls of the via 106, sidewalls of the passive device component 110 and sidewalls of the connection structure 140 are in contact with the molding compound 102. In some embodiments, the passive device compound 110 is electrically coupled to the connection structure 120 disposed over the first surface 104a of the molding compound 102, and the first surface 104a can therefore be referred to as a front surface, and the second surface 104b can be referred to as a back surface. In some embodiments, the first surface 104a is in contact with a bottom surface of the connection structure 120, and the second surface 104b is in contact with a bottom surface of the connection structure 130. In some embodiments, sidewalls of the molding compound 102, sidewalls of the connection structure 120 and sidewalls of the connection structure 130 are exposed as shown in FIG. 1, but the disclosure is not limited thereto.

Figure 2:
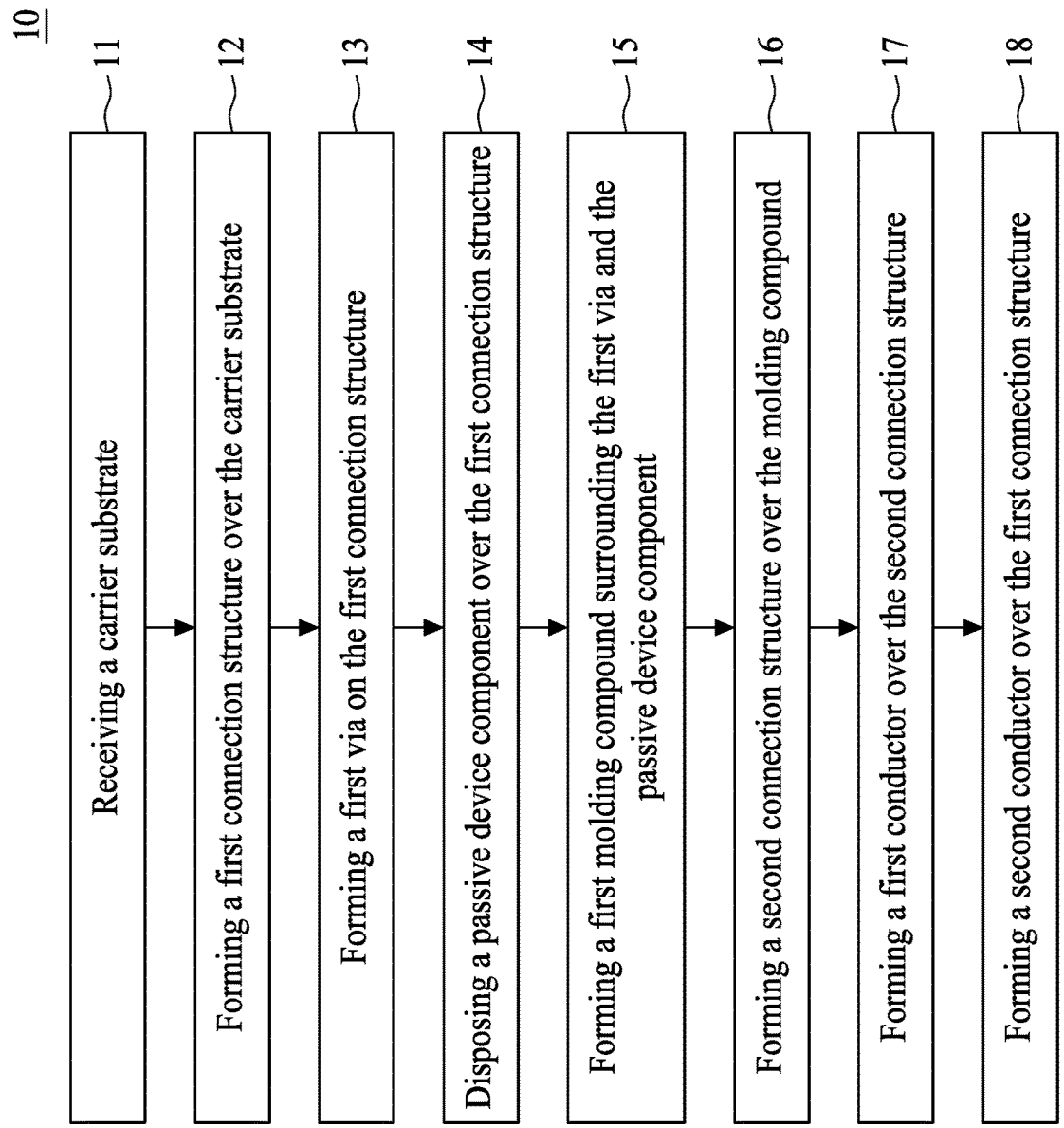
FIG. 2 is a flow diagram representing a method for manufacturing a semiconductor package structure in accordance with some embodiments of the present disclosure.

FIG. 2 is a flow diagram representing a method for manufacturing a semiconductor package structure in accordance with some embodiments of the present disclosure, and FIGS. 3A through 3J illustrate sectional views of a semiconductor package structure at various fabrication stages constructed according to aspects of the present disclosure in one or more embodiments. In some embodiments, a method of forming a semiconductor package structure 10 is provided. The method 10 includes a number of operations (11, 12, 13, 14, 15, 16, 17 and 18).

Figure 3A:
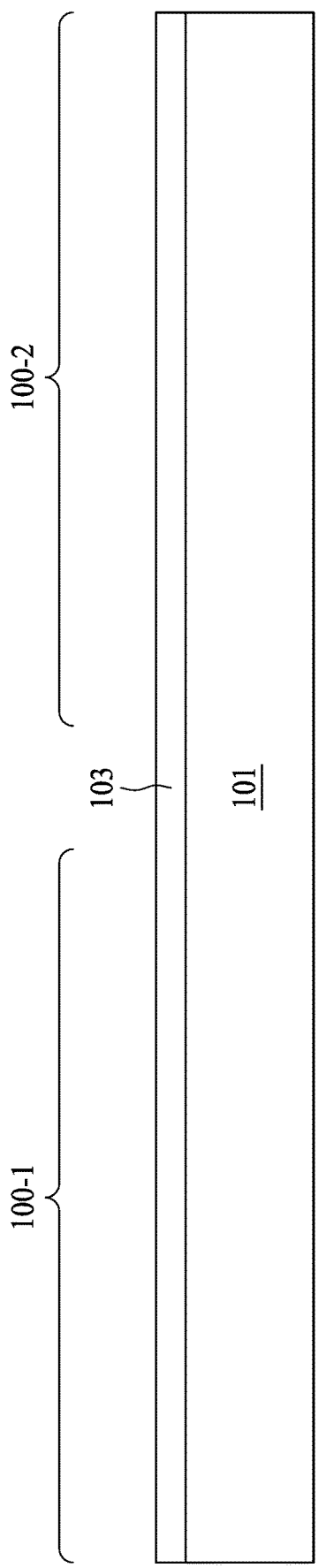
FIGS. 3A through 3J illustrate sectional views of a semiconductor package structure at various fabrication stages constructed according to aspects of the present disclosure in one or more embodiments.

Referring to FIG. 3A, a carrier substrate 101 can be provided or received in operation 11. The carrier substrate 101 can include a glass carrier substrate, a ceramic carrier substrate, or the like. In some embodiments, a release layer 103 can be formed over the carrier substrate 101. The release layer 103 may be formed of a polymer-based material, which may be removed along with the carrier substrate 101 in subsequent operations. In some embodiments, the release layer 103 is an epoxy-based thermal-release material, which loses its adhesive property when heated, such as a light-to-heat conversion (LTHC) release coating. In some embodiments, the release layer 103 may be an ultraviolet (UV) glue, which loses its adhesive property when exposed to UV light. The release layer 103 can be a liquid that is dispensed and cured, a laminate film that is disposed onto the carrier substrate 101, or a layer of another form and method of disposition. A top surface of the release layer 103 can be level and may have a high degree of planarity, as shown in FIG. 3A. In some embodiments, package regions 100-1 and 100-2 for manufacturing semiconductor package structures, respectively, can be defined over the carrier substrate 101.

Figure 3B:
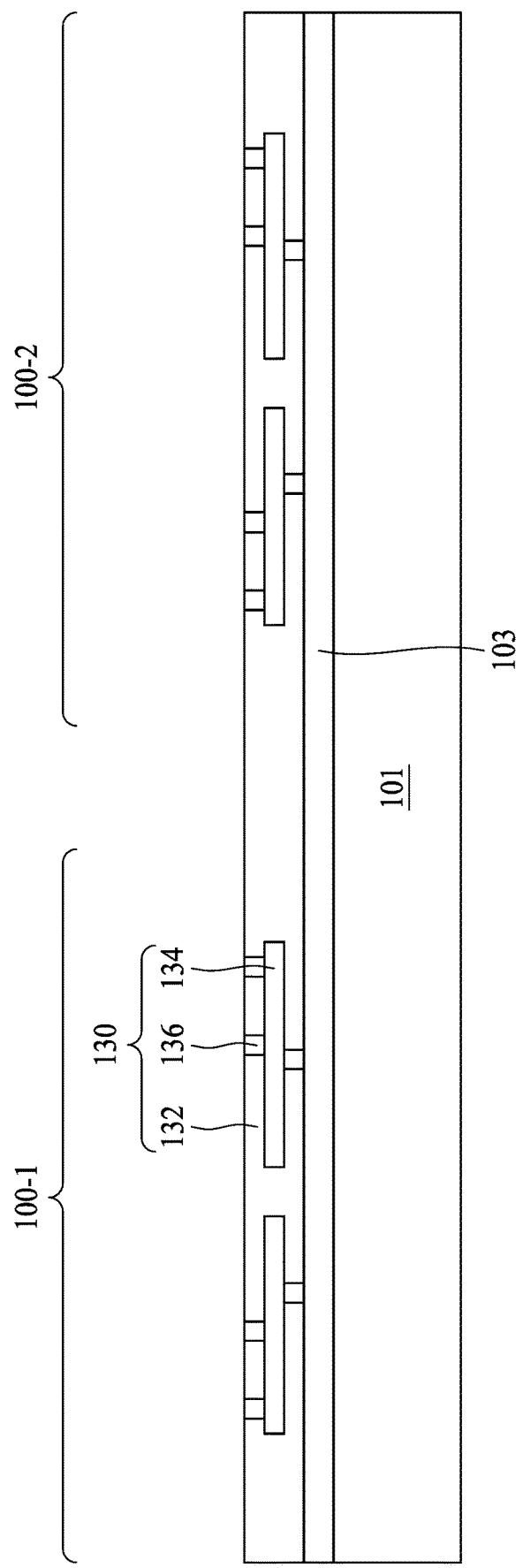

Referring to FIG. 3B, a connection structure 130 is formed over the carrier substrate 101 in operation 12. The connection structure 130 is formed in each of the package regions 100-1 and 100-2. In some embodiments, the connection structure 130 can be a redistribution layer (RDL), but the disclosure is not limited thereto. The connection structure 130 can include a dielectric layer 132, a conductive layer 134 disposed in the dielectric layer 132, and a via 136 disposed in the dielectric layer 132. The conductive layer 134 can be a conductive line electrically coupled to the via 136. The connection structure 130 can include any number of dielectric layers 132, any number of conductive layers 134 and any number of vias 136. Materials used to form the dielectric layer 132, the conductive layer 134 and the via 136 can be similar to those described above, therefore details are omitted in the interest of brevity.

Figure 3C:
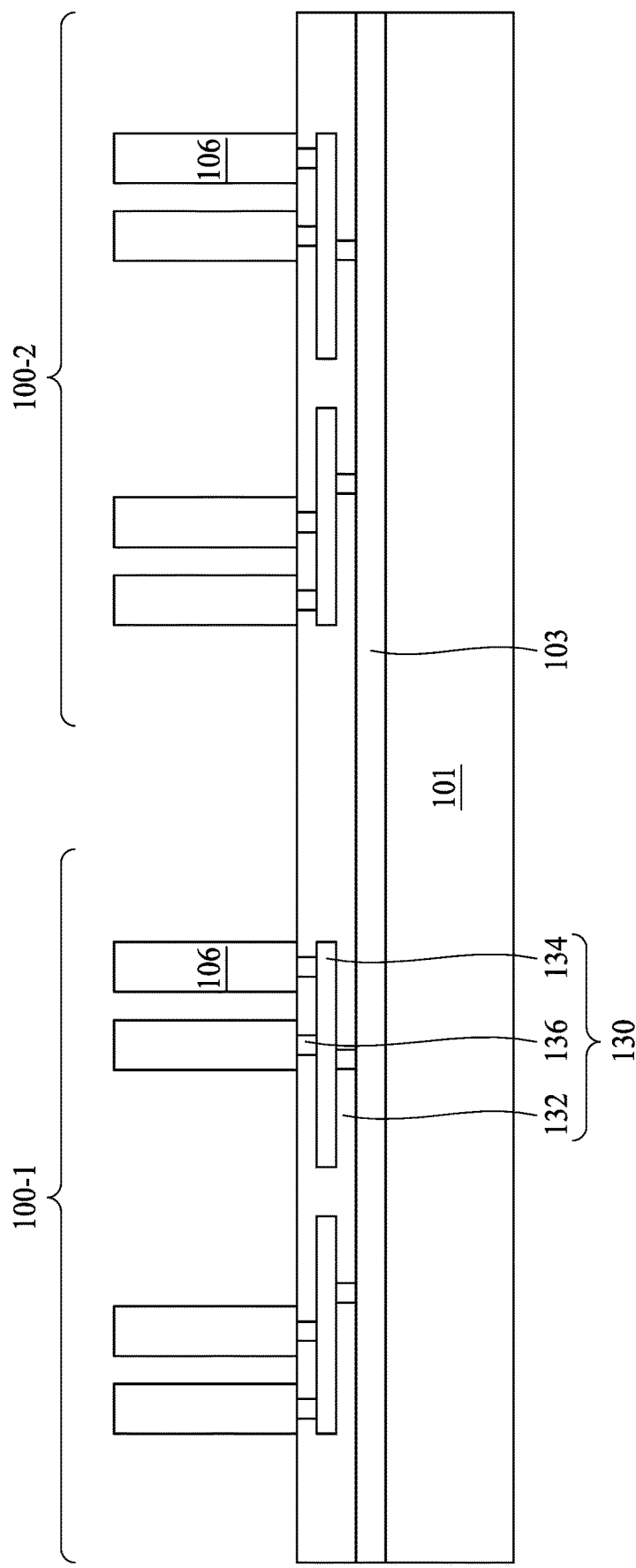

Referring to FIG. 3C, a via 106 is formed on the connection structure 130 in operation 13. The via 106 is formed in each of the package regions 100-1 and 100-2. In some embodiments, a patterned photoresist (not shown) can be formed over the connection structure 130. The patterned photoresist includes openings exposing conductive materials in the connection structure 130. In some embodiments, a seed layer can be formed overlying the patterned photoresist, and a conductive material is subsequently formed to fill the openings. In some embodiments, the conductive material can be formed by a plating process including, for example but not limited thereto, an electro-chemical plating, an electroless plating, or the like. In some embodiments, a chemical mechanical polishing (CMP) process can be performed to remove excess portions of the conductive material. In some embodiments, the patterned photoresist is removed and thus the via 106 is obtained as shown in FIG. 3C. In some embodiments, a wet strip process can be used to remove the patterned photoresist. In some embodiments, a wet strip solution, including, for example but not limited thereto, dimethyl sulfoxide (DMSO) and tetramethyl ammonium hydroxide (TMAH), can be used to remove the patterned photoresist.

Figure 3D:
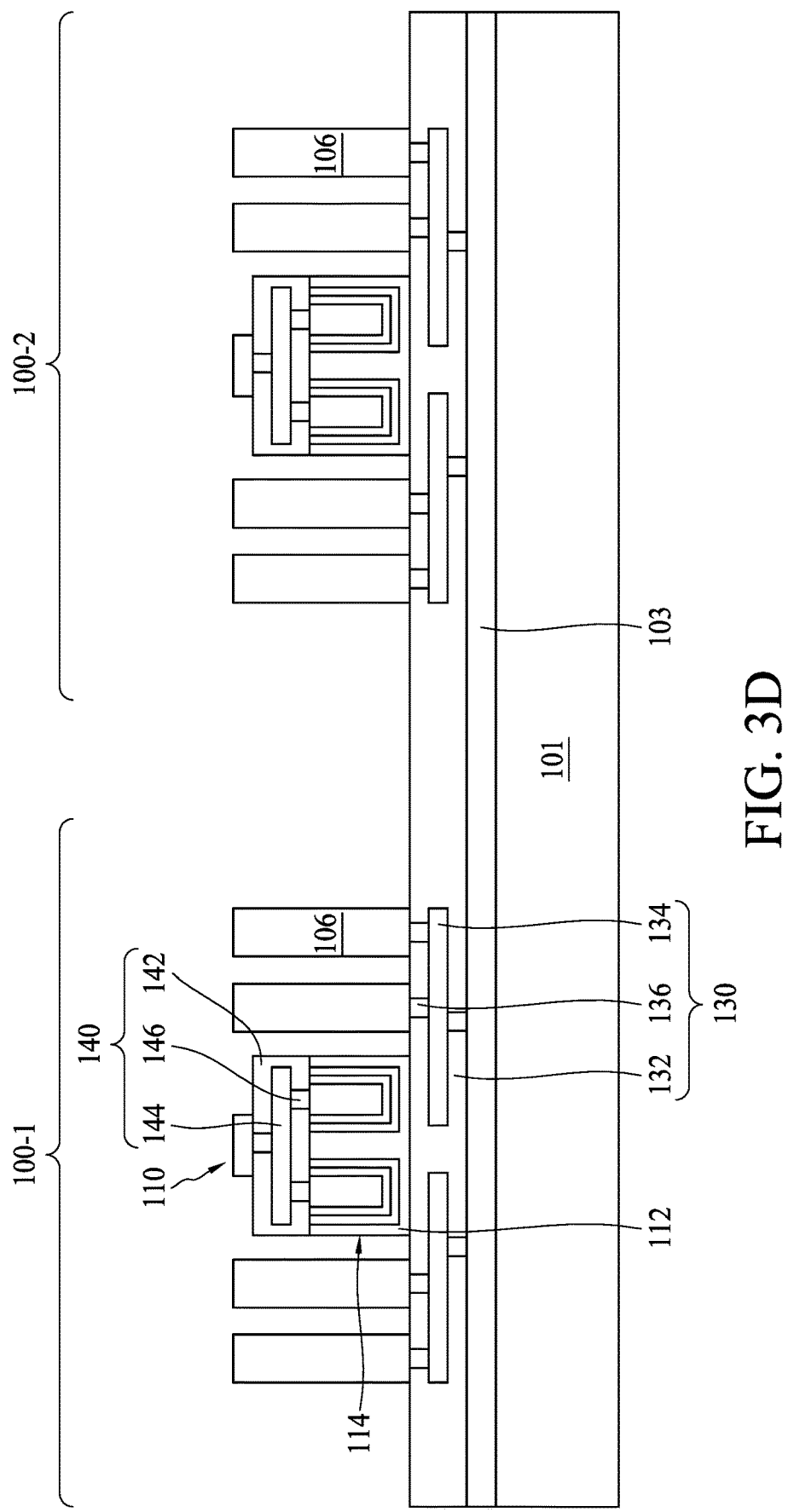

Referring to FIG. 3D, a passive device component 110 is disposed over the connection structure 130 in operation 14. Further, the passive device component 110 is formed in each of the package regions 100-1 and 100-2. As mentioned above, the passive device component 110 can include a semiconductor substrate 112 and a passive device 114 formed in the semiconductor substrate 112. The semiconductor substrate 112 can include the same material as mentioned above, and the passive device 114 can be the devices mentioned above, and therefore such details are omitted for brevity.

Still referring to FIG. 3D, another connection structure 140 can be formed over the passive device component 110. The connection structure 140 can include a dielectric layer 142, a conductive layer 144 disposed in the dielectric layer 142, and a via 146 disposed in the dielectric layer 142. The conductive layer 144 can be a conductive line electrically coupled to the via 146. The connection structure 140 can include any number of dielectric layers 142, any number of conductive layers 144 and any number of vias 146. Materials used to form the dielectric layer 142, the conductive layer 144 and the via 146 can be similar to those described above, and therefore such details are omitted for brevity. Significantly, a thickness of the passive device component 110 is less than a height of the via 106.

In some embodiments, the passive device component 110 and the connection structure 140 can be manufactured in another wafer (not shown) by wafer-level manufacturing operations. In some embodiments, the wafer-level manufacturing operations are performed to form a plurality of passive devices 114 in the wafer and the connection structure 140 on the wafer, and the passive device component 110 and the connection structure 140 can be obtained by singulating the wafer after the manufacturing operations. Significantly, all available wafer area of the wafer is utilized to form the passive device component 110.

In some embodiments, a sum of the thickness of the passive device component 110 and a thickness of the connection structure 140 can be similar to the height of the via 106. In other embodiments, the sum of the thickness of the passive device component 110 and the thickness of the connection structure 140 can be less than the height of the via 106, as shown in FIG. 3D. In some embodiments, the height of the via 106 can be determined according to the passive device component 110. For example, when the passive device 114 of the passive device component 110 is a deep-trench capacitor, the height of the passive device component 110 may be greater than the passive device components that include other types of passive device, and the height of the via 106 can be increased in order to accommodate the passive device component 110. Further, a distance between the vias 106 proximal to the passive device component 110 can be determined according to a width or length of the passive device component 110. For example, when the passive device 114 of the passive device component 110 is an inductor, the width or length of the passive device component 110 may be greater than that of the passive device components that include other types of passive device, and the distance between the vias 106 proximal to the passive device component 110 can be increased in order to accommodate the passive device component 110.

In some embodiments, a test, such as an electrical test, can be performed on the passive device component 110 through the connection structure 140 before the disposing of the passive device component 110. The electrical test is performed to screen out unqualified passive device components 110 and/or unqualified connection structures 140, thereby improving the yield.

Figure 3E:
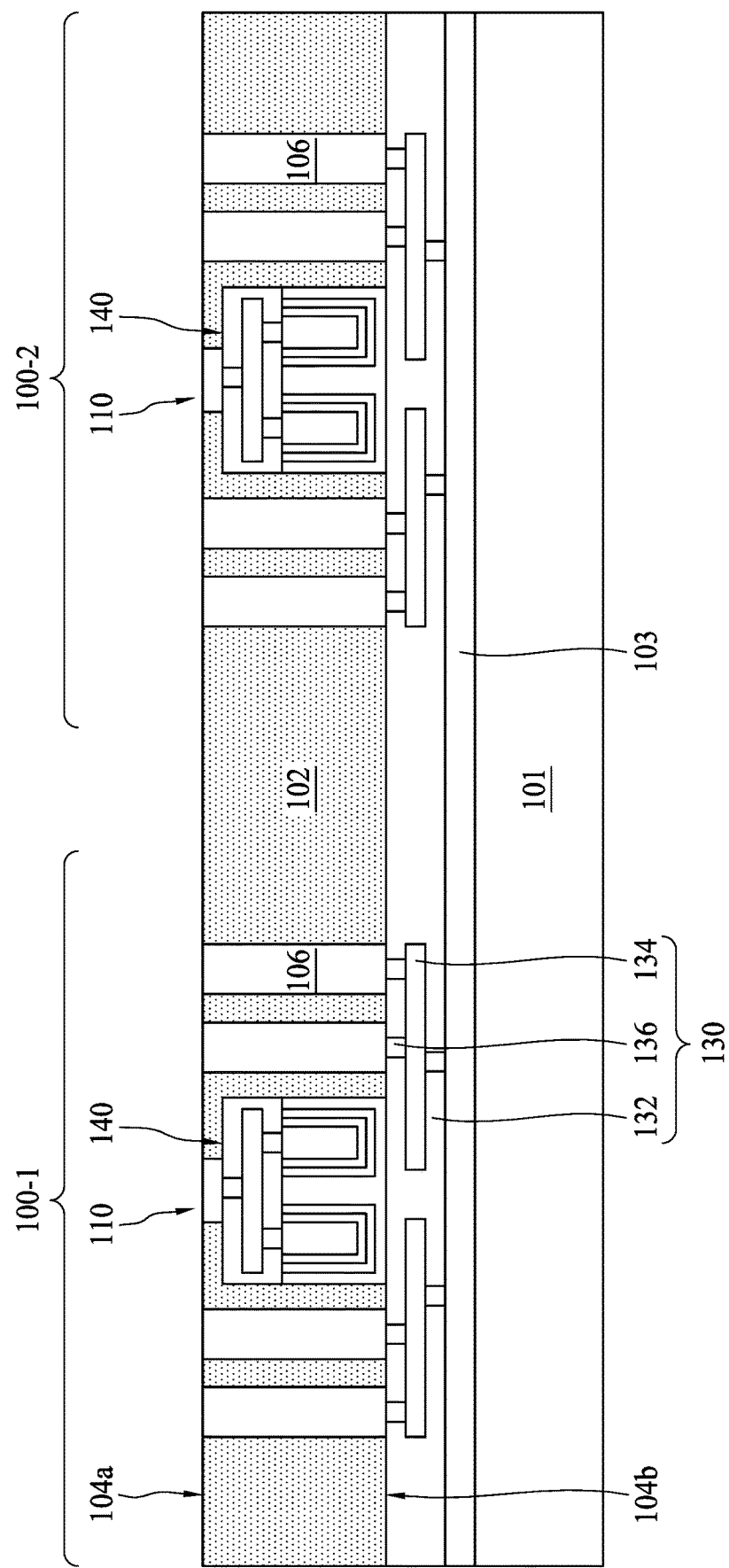

Referring to FIG. 3E, a molding compound 102 is formed over the connection structures 130 to surround the vias 106 and the passive device components 110 in the package regions 100-1 and 100-2 in operation 15. As shown in FIG. 3E, the molding compound 102 is in contact with sidewalls of the via 106, sidewalls of the passive device component 110, sidewalls of the connection structure 140 and a top surface of the connection structure 130. Additionally, the molding compound 102 is in contact with a portion of a top surface of the connection structure 140. The molding compound 102 can be applied by compression molding, transfer molding, or the like.

Figure 3F:
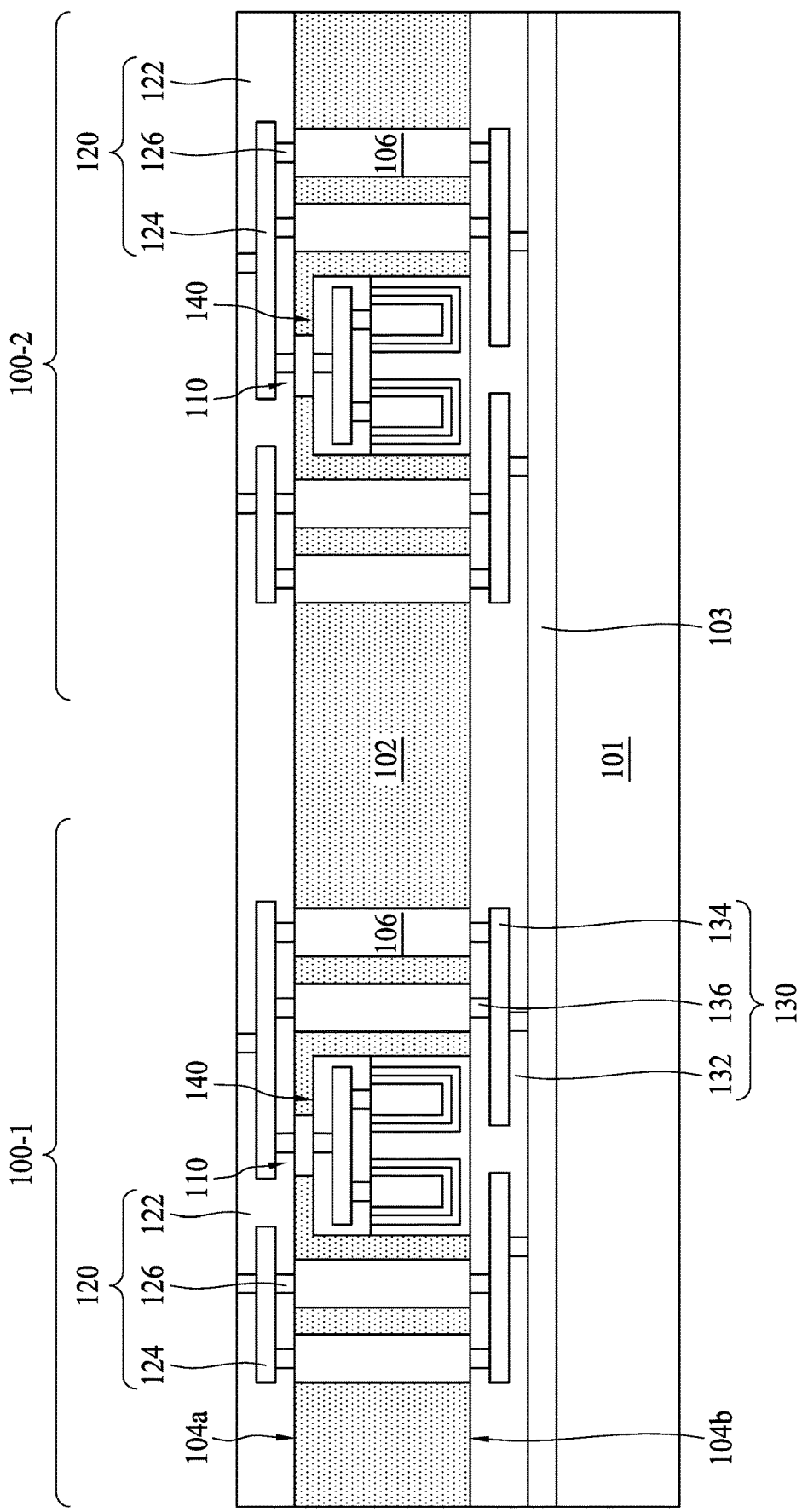

Referring to FIG. 3F, a connection structure 120 is formed over the molding compound 102 in operation 16. The connection structure 120 is formed in each of the package regions 100-1 and 100-2. In some embodiments, the connection structure 120 can be an RDL. The connection structure 120 can include a dielectric layer 122, a conductive layer 124 disposed in the dielectric layer 122, and a via 126 disposed in the dielectric layer 122. The conductive layer 124 can be a conductive line electrically coupled to the via 126. The connection structure 120 can include any number of dielectric layers 122, any number of conductive layers 124 and any number of vias 126. Materials used to form the dielectric layer 122, the conductive layer 124 and the via 126 can be similar to those described above, and therefore such details are omitted in the interest of brevity. Significantly, the passive device component 110 is electrically coupled to the connection structure 120 through the connection structure 140, as shown in FIG. 3F.

Figure 3G:
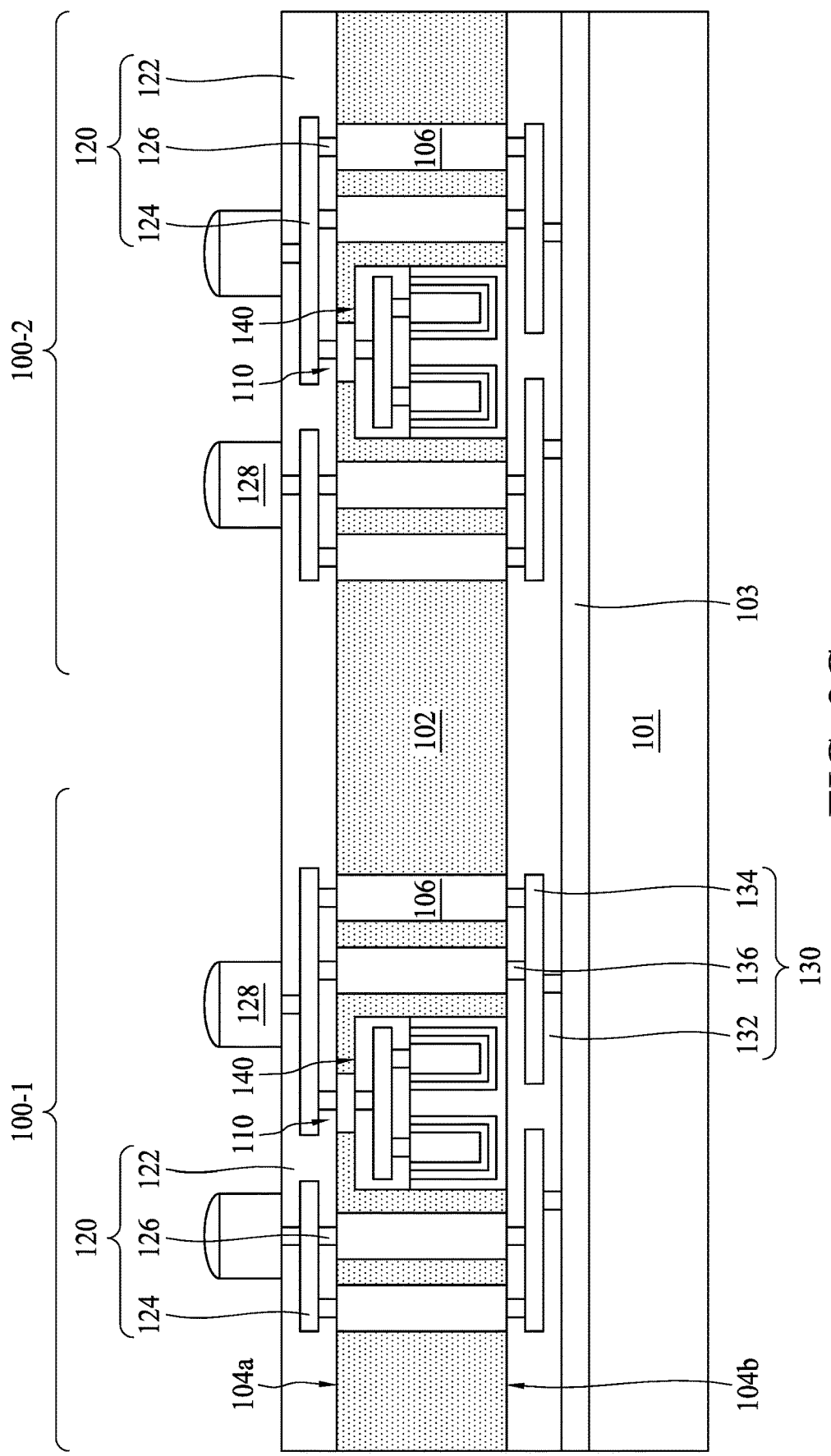

Referring to FIG. 3G, a conductor 128 is formed over the connection structure 120 in operation 17. In some embodiments, a pad (not shown) can be formed on the exterior surface of the connection structure 120. The pad is electrically coupled to the via 126 or the conductive layer 124, and may be referred to as an under bump metallization (UBM). In some embodiments, a seed layer (not shown) can be formed over the exterior surfaces of the connection structure 120. In some embodiments, the seed layer is a metal layer, and may be a single layer or a composite layer including a plurality of sub-layers formed of different materials. In some embodiments, the seed layer includes a Ti layer and a Cu layer over the Ti layer. The seed layer may be formed using, for example, PVD or the like. A patterned photoresist (not shown) is then formed on the seed layer. The patterned photoresist can include an opening (not shown) corresponding to the pad. A conductive material is formed in the opening and on the exposed portions of the seed layer to form the pad. The conductive material may be formed by plating, such as electroplating or electroless plating, or the like. The conductive material may include a metal, such as Cu, Ti, W or Al, but the disclosure is not limited thereto.

Still referring to FIG. 3G, the conductor 128 can be formed on the UBM. In some embodiments, the conductor 128 is formed by initially forming a layer of solder through such commonly used methods as evaporation, electroplating, printing, solder transfer, ball placement or the like. Once a layer of solder has been formed on the structure, a reflow may be performed in order to shape the material into the desired bump shapes. In another embodiment, the conductor 128 includes a metal pillar (such as a copper pillar) formed by sputtering, printing, electro-plating, electroless plating, CVD, or the like. The metal pillar may be solder free and may have substantially vertical sidewalls.

Figure 3H:
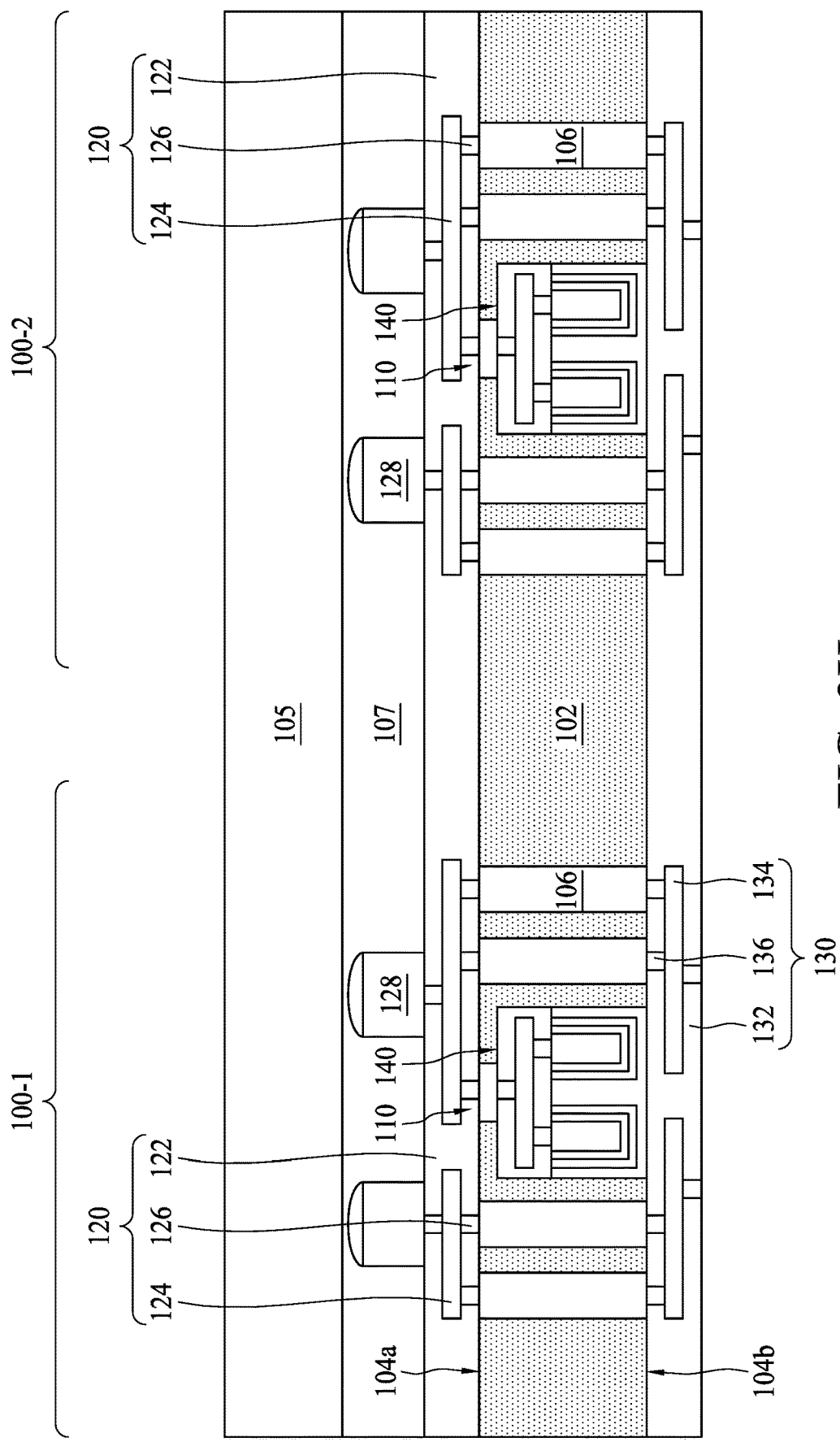

Referring to FIG. 3H, in some embodiments, the carrier substrate 101 is removed to expose a surface of the connection structure 130. In other words, an exterior surface of the connection structure 130 is exposed after removing the carrier substrate 101. In some embodiments, the structure shown in FIG. 3H can be flipped over and attached to another carrier substrate 105 by another release layer 107. The carrier substrate 101 can be removed by a de-bonding operation. In some embodiments, the de-bonding operation includes projecting a light such as a laser light or a UV light on the release layer 103 such that the release layer 103 is decomposed under the heat of the light and the carrier substrate 101 can be removed.

Figure 3I:
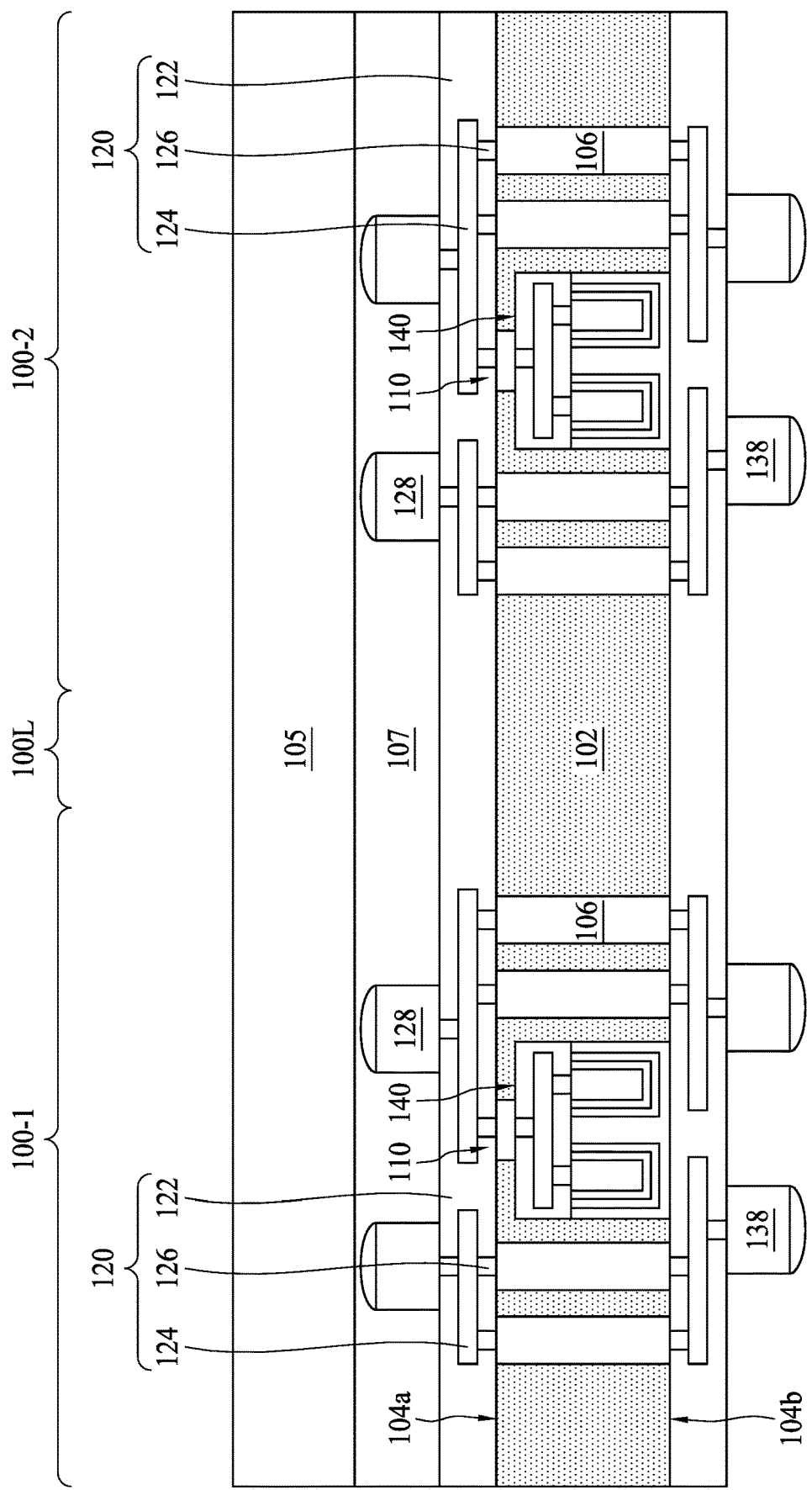

Referring to FIG. 3I, in some embodiments, a conductor 138 can be formed over the surface of the connection structure 130 in operation 18. As mentioned above, a pad (not shown) can be formed on the exterior surface of the connection structure 130. The pad is electrically coupled to the connection structure 130, and may be referred to as a UBM. Subsequently, the conductor 138 is formed on the UBM. As mentioned above, the conductor 138 is formed by initially forming a layer of solder through such commonly used methods as evaporation, electroplating, printing, solder transfer, ball placement or the like. Once a layer of solder has been formed on the structure, a reflow may be performed in order to shape the material into the desired bump shapes. In another embodiment, the conductor 138 includes a metal pillar (such as a copper pillar) formed by a sputtering, printing, electro plating, electroless plating, CVD or the like. The metal pillar may be solder free and may have substantially vertical sidewalls.

Figure 3J:
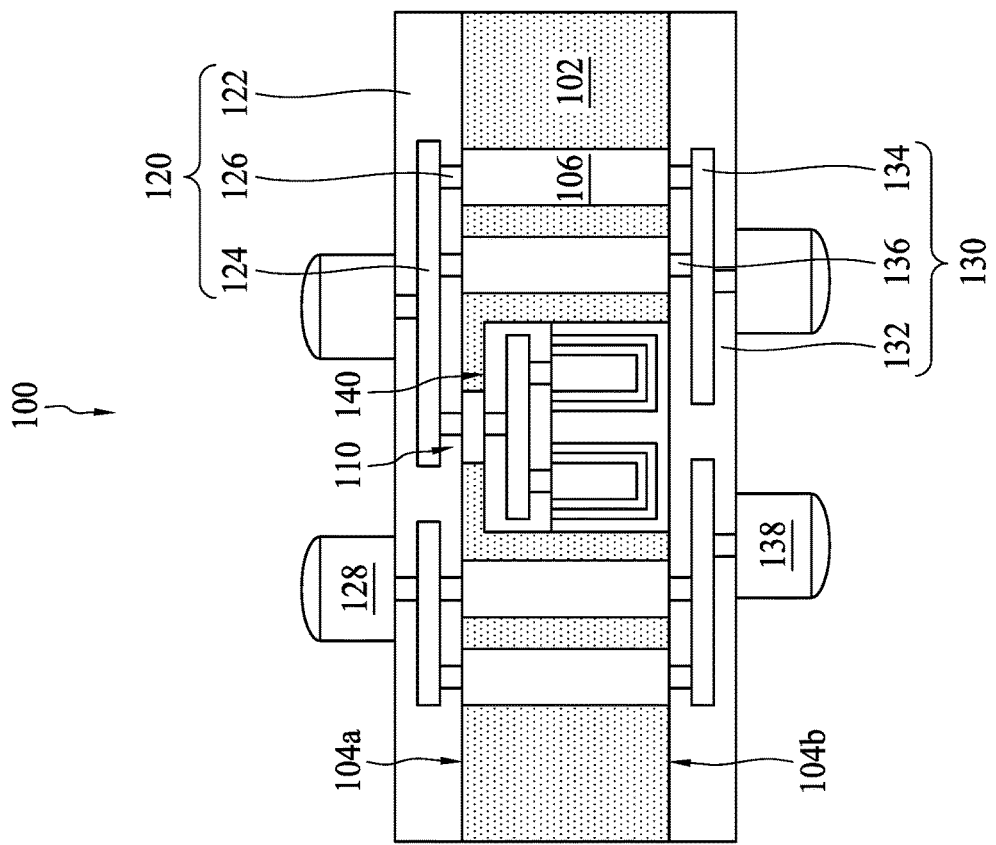
Figure 3J:
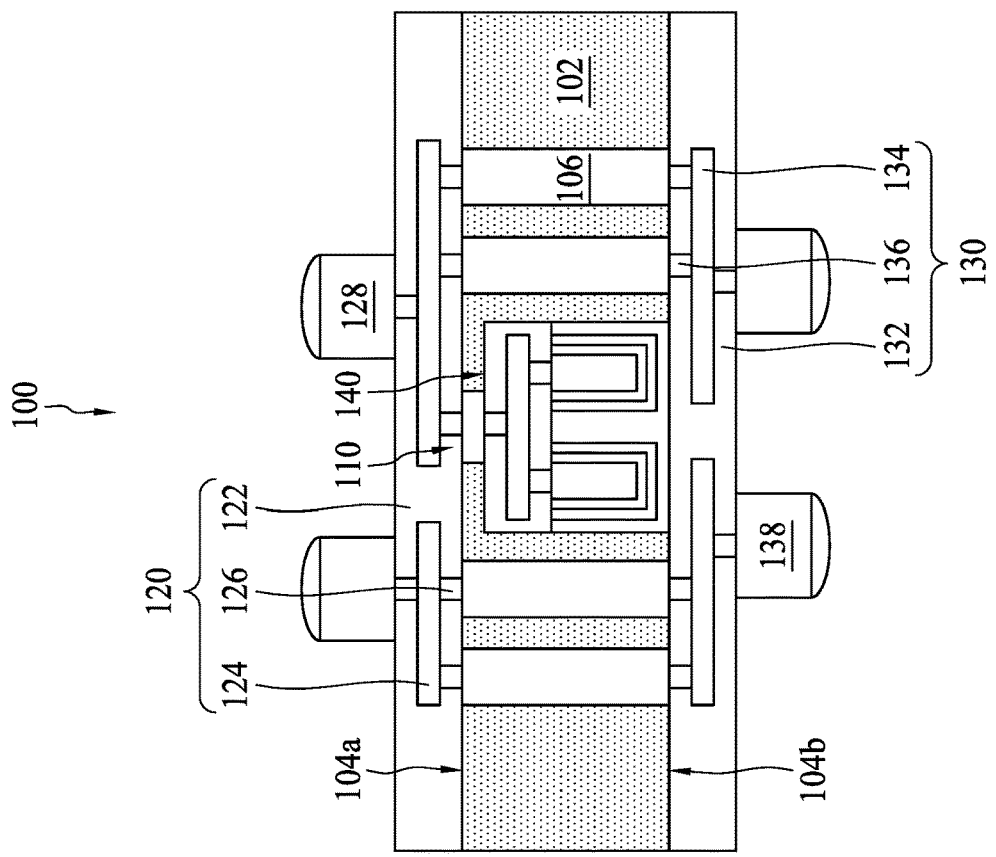

Referring to FIGS. 3I and 3J, in some embodiments, the carrier substrate 105 is removed. The carrier substrate 105 can be removed by a de-bonding operation. In some embodiments, the de-bonding operation includes projecting a light such as a laser light or a UV light on the release layer 107 such that the release layer 107 is decomposed under the heat of the light and the carrier substrate 105 can be removed. A singulation process can be performed by dicing along scribe line regions, e.g., between adjacent package regions 100-1 and 100-2, such as along a line 100L. A dicing saw or laser cutting may be used, in various embodiments. The singulation operation separates the package regions 100-1 and 100-2 from each other, and a plurality of semiconductor package structures 100, such as the semiconductor package structure 100 shown in FIGS. 1 and 3J, is formed. In other words, the connection structure 120, the molding compound 102 and the connection structure 130 are cut and singulated to form the semiconductor package structures 100 as shown in FIGS. 1 and 3J.

In the present disclosure, by adopting the TMV 106, instead of a TSV, in the semiconductor package structure 100, greater integration is achieved. In addition, the method 10 is more compatible with different kinds of IPDs and different formation operations. Further, the stress issue can be mitigated, and the IPDs can be tested before the manufacturing operation is completed, thus improving process yield control.

Figure 4:
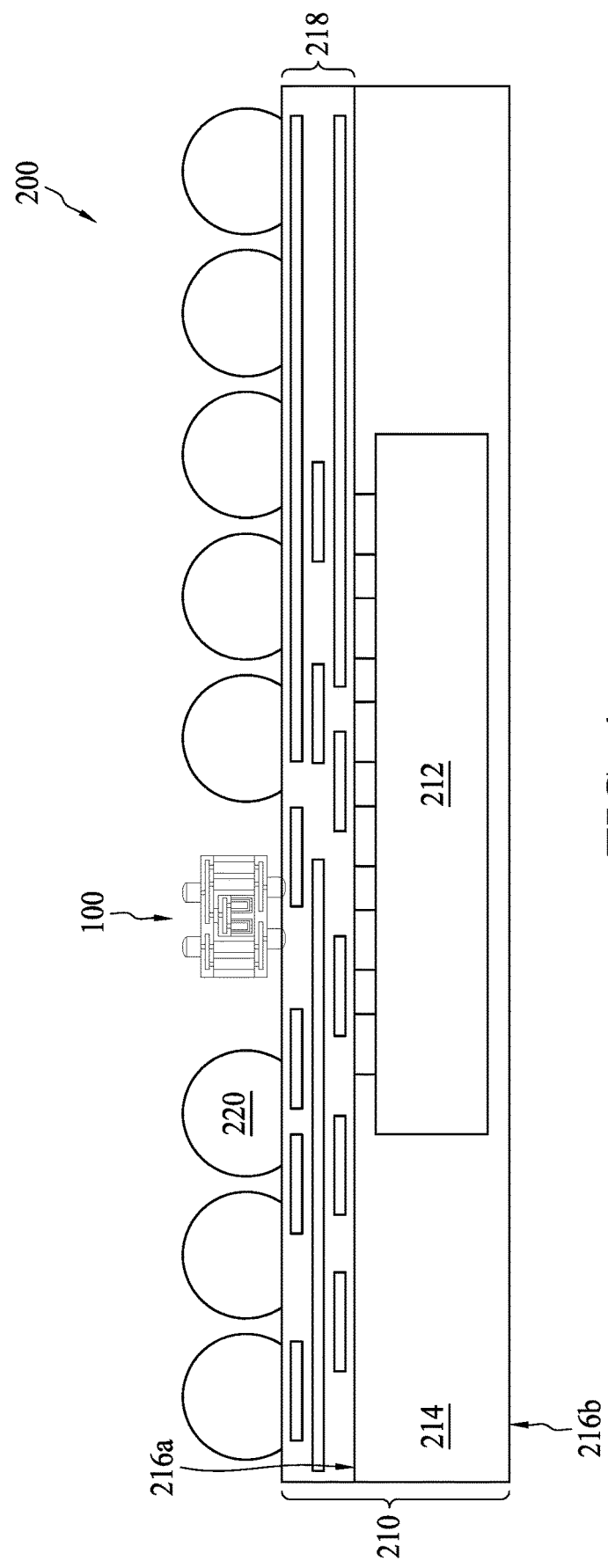
FIG. 4 is a schematic drawing illustrating a semiconductor package structure in accordance with some embodiments of the present disclosure.

FIG. 4 is a schematic drawing illustrating a semiconductor package structure in accordance with some embodiments of the present disclosure. In some embodiments, the package structure 100 can be integrated with another package structure to form, for example but not limited thereto, a 3D package or a PoP. For example, the package structure 100 can be disposed over another package structure 210. As shown in FIG. 4, a semiconductor package structure 200 can be obtained by integrating the package structure 100 with another package structure 210. In some embodiments, the package structure 210 is disposed over the second surface 104b (the back surface) of the package structure 100. Further, the package structure 100 is electrically coupled to the package structure 210 through the conductor 138 and the connection structure 130. However, in other embodiments, the package structure 210 is disposed over the first surface 104a (the front surface) of the package structure 100. In such embodiments, the package structure 100 is electrically coupled to the package structure 210 by the conductor 128 and the connection structure 120.

Still referring to FIG. 4, in some embodiments, the package structure 210 can include a die 212, such as a system-on-chip (SoC) die, a power management integrated circuit (PMIC) die, an application specific integrated circuit (APIC) die or a logic die, but the disclosure is not limited thereto. In some embodiments, the package structure 210 includes a molding compound 214 surrounding the die 212, wherein the molding compound 214 has a third surface 216a facing the package structure 100 and a fourth surface 216b opposite to the third surface 216a. In some embodiments, the package structure 210 further includes a connection structure 218 disposed over the third surface 216a of the molding compound 214, and a conductor 220 disposed over the connection structure 218. The conductor 220 can provide an external connection for the package structure 210. As shown in FIG. 4, the connection structure 218 electrically couples the die 212 to the conductor 220. Further, the conductor 138 of the package structure 100 is electrically coupled to the connection structure 218 of the package structure 210, and thus the package structures 100 and 210 are electrically connected. In some embodiments, a diameter of the conductor 220 of the package structure 210 is greater than a diameter of the conductor 138 of the package structure 100, but the disclosure is not limited thereto.

Figure 5:
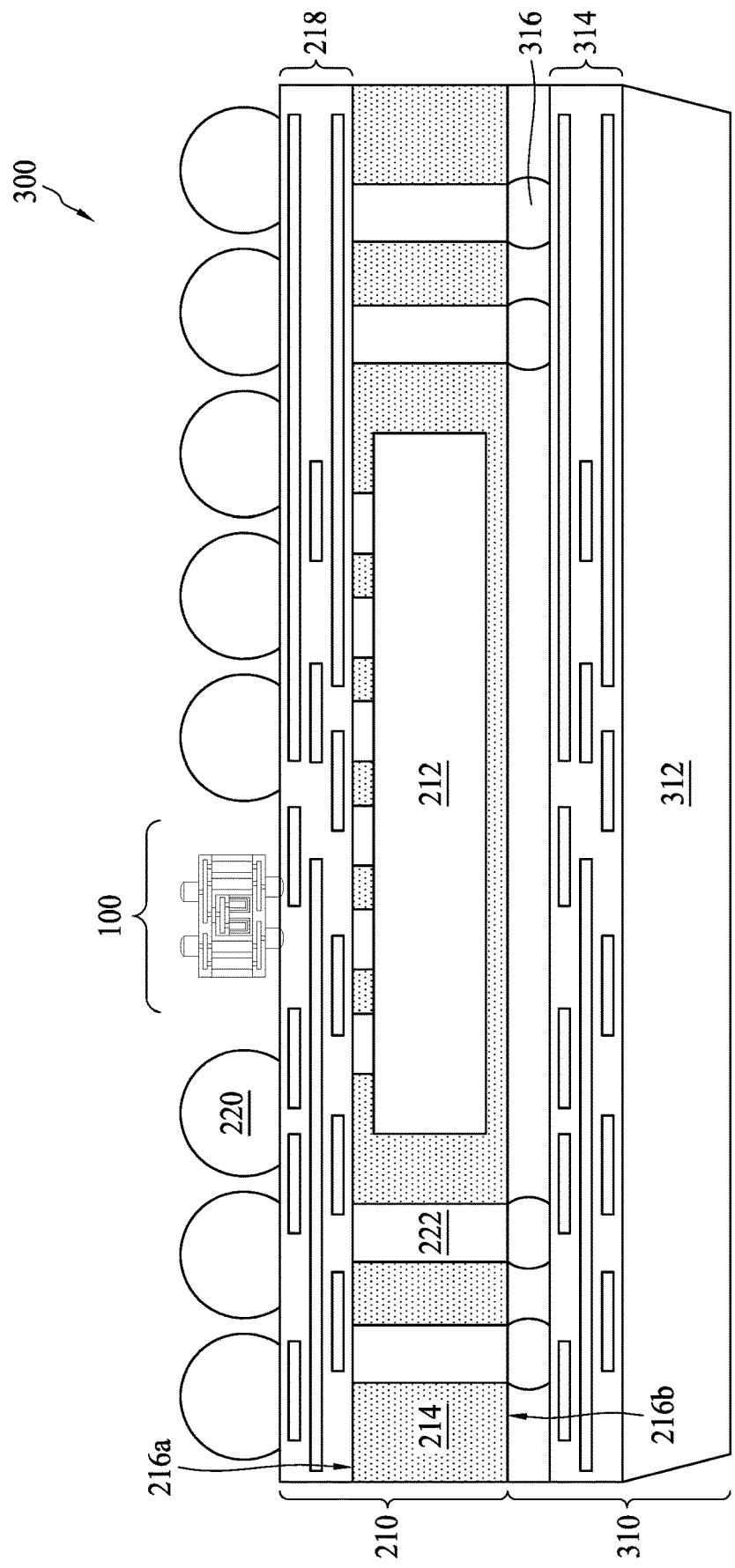
FIG. 5 is a schematic drawing illustrating a semiconductor package structure in accordance with some embodiments of the present disclosure.

FIG. 5 is a schematic drawing illustrating a semiconductor package structure in accordance with some embodiments of the present disclosure. It should be noted that details of same elements shown in FIGS. 4 and 5 are omitted for brevity. In some embodiments, the package structure 100 can be integrated with another package structure to form, for example but not limited thereto, a 3D package or a PoP. As shown in FIG. 5, a semiconductor package structure 300 can be obtained by integrating the package structure 100 with other package structures 210 and 310. In some embodiments, the package structures 210 and 310 are disposed over the back surface 104b of the package structure 100, but the disclosure is not limited thereto. Further, the package structure 100 is electrically coupled to the package structure 210 through the conductor 138 and the connection structure 130, but the disclosure is not limited thereto.

Still referring to FIG. 5, in some embodiments, the package structure 210 can include a die 212, such as a SoC die, a molding compound 214 surrounding the die 212, wherein the molding compound 214 has a third surface 216a facing the package structure 100 and a fourth surface 216b opposite to the third surface 216a, a connection structure 218 disposed over the third surface 216a of the molding compound 214, and a conductor 220 disposed over the connection structure 218. In some embodiments, the package structure 210 further includes a via 222 penetrating the molding compound 214 from the third surface 216a to the fourth surface 216b. In some embodiments, the package structure 310 includes a die 312, such as a DRAM die, but the disclosure is not limited thereto. In some embodiments, the package structure 310 further includes a connection structure 314 disposed over the die 312 and a conductor 316 disposed over and electrically coupled to the connection structure 314. In some embodiments, a width or a diameter of the conductor 316 is substantially the same as the width or the diameter of the conductor 220. In other embodiments, the width or the diameter of the conductor 316 is less than the width or the diameter of the conductor 220.

In some embodiments, the package structure 310 is electrically coupled to the package structure 210 by the conductor 316. As shown in FIG. 5, the die 312, the connection structure 314 and the conductor 316 can be disposed over the fourth surface 216b of the molding compound 214, with the conductor 316 disposed between the molding compound 214 and the connection structure 314. The connection structure 314 is electrically coupled to the via 222 through the conductor 316. Accordingly, the package structures 100, 210 and 310 are electrically connected through the conductors 138 and 316, the connection structures 130, 218 and 314, and the via 222.

Figure 6:
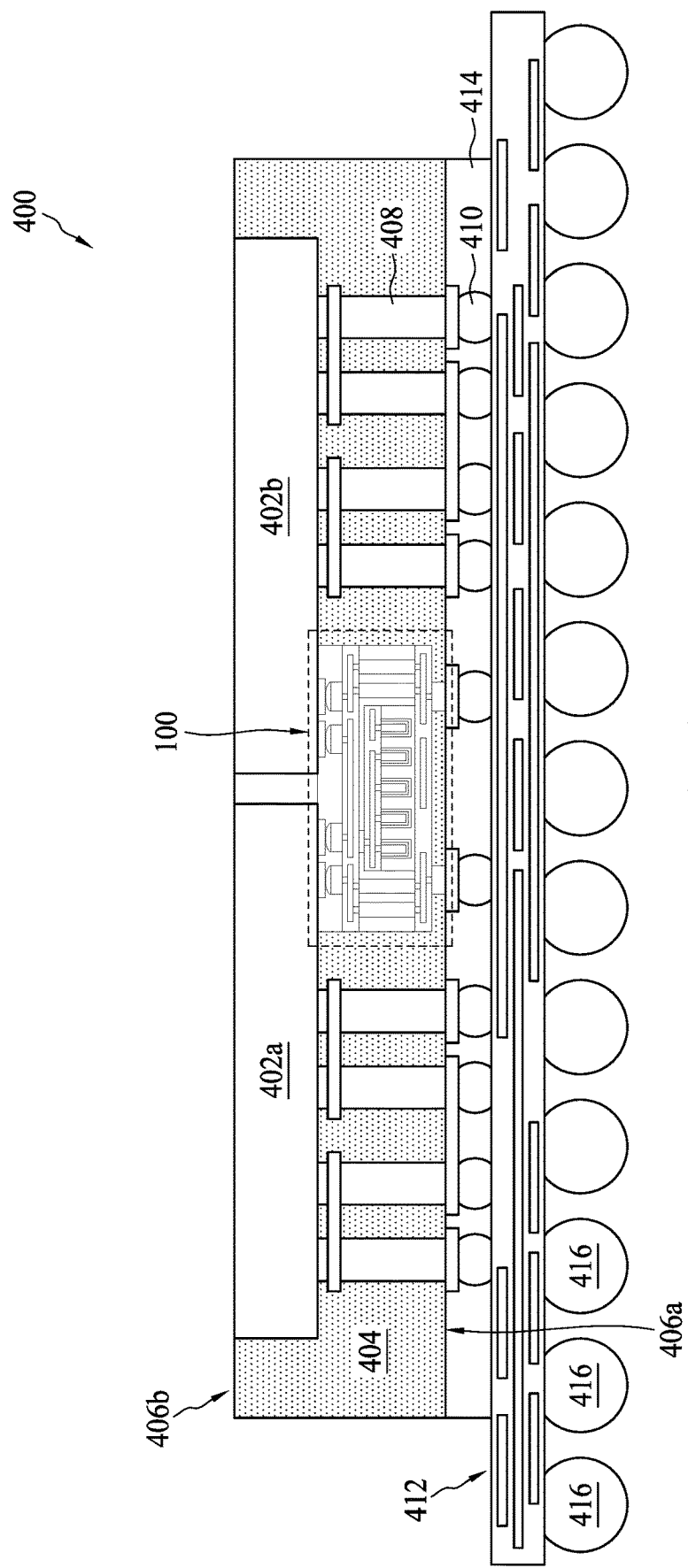
FIG. 6 is a schematic drawing illustrating a semiconductor package structure in accordance with some embodiments of the present disclosure.

FIG. 6 is a schematic drawing illustrating a semiconductor package structure in accordance with some embodiments of the present disclosure. In some embodiments, the package structure 100 can be integrated with another package structure to form, for example but not limited thereto, a 3D package or a PoP. For example, the package structure 100 can be integrated with other dies to form a semiconductor package structure 400, as shown in FIG. 6. In some embodiments, the semiconductor package structure 400 includes a first die 402a and a second die 402b. In some embodiments, the first die 402a can be an SoC die, a PMIC die, an APIC die, or a logic die, but the disclosure is not limited thereto. The second die 402b can be a SoC die, a PMIC die, an APIC die, or a logic die, but the disclosure is not limited thereto. Further, the first die 402a and the second die 402b can be the same dies or different dies. In some embodiments, a connection structure such as an RDL can be respectively disposed over an active surface, which is the surface on which active devices are formed, of the first die 402a and the second die 402b, but the disclosure is not limited thereto.

The package structure 100 can be electrically coupled to first die 402a and/or the second die 402b with the active surfaces of the first die 402a and the second die 402b facing the package structure 100. In some embodiments, the first surface 104a (the front surface) of the package structure 100 faces the first die 402a and the second die 402b, and the package structure 100 is electrically coupled to the first die 402a and/or the second die 402b through the conductor 128 and the connection structure 120. However, in other embodiments, when the second surface 104b (the back surface) of the package structure 100 faces the first die 402a and the second die 402b, the package structure 100 is electrically coupled to the first die 402a and/or the second die 402b by the conductor 138 and the connection structure 130. In such embodiments, the first die 402a and the second die 402b are electrically coupled to each other through the package structure 100. In such embodiments, the package structure 100 can be referred to as a bridge between the first and second dies 402a and 402b. Consequently, die-to-die communications can be improved by the package structure 100.

Still referring to FIG. 6, in some embodiments, the semiconductor package structure 400 further includes a molding compound 404, wherein the molding compound 404 has a third surface 406a and a fourth surface 406b opposite to the third surface 406a. In some embodiments, bottom surfaces (which are free of the active devices) of the first die 402a and the second die 402b are exposed through the fourth surface 406b of the molding compound 404, but the disclosure is not limited thereto. In some embodiments, the package structure 400 further includes a plurality of vias 408 disposed in the molding compound 404 and electrically coupled to the first die 402a and the second die 402b. In some embodiments, the operations for forming the plurality of vias 408 can be similar to those described above, therefore such details are omitted for brevity. In some embodiments, the molding compound 404 is formed to encompass the first die 402a, the second die 402b, the package structure 100 and the plurality of vias 408. The operations for forming the molding compound 404 can be similar to those described above, and therefore such details are omitted for brevity. In some embodiments, a height of the plurality of vias 408 in the molding compound 404 is greater than a height of the via 106 in the molding compound 102, but the disclosure is not limited thereto. In some embodiments, a diameter of the plurality of vias 408 is greater than a diameter of the via 106, but the disclosure is not limited thereto.

In some embodiments, a connection structure (not shown) such as an RDL can be disposed over the third surface 406a of the molding compound 404, and a conductor 410 can be disposed over the connection structure. In some embodiments, another die, another substrate, another package or another connection structure such as an RDL 412 can be disposed over and electrically connected to the conductors 410 as shown in FIG. 6. In some embodiments, an underfill 414 can be formed to fill gaps between the conductors 410 and the RDL 412. Further, a plurality of conductors 416 can be disposed over and electrically coupled to the RDL 412 to provide external connection. In such embodiments, the conductor 416, the conductor 410 and the via 408 serve as power traces, but the disclosure is not limited thereto. In some embodiments, a diameter of the conductor 416 can be greater than a diameter of the conductor 410, and the diameter of the conductor 410 can be greater than the diameters of the conductors 128 and 130, but the disclosure is not limited thereto.

Figure 7:
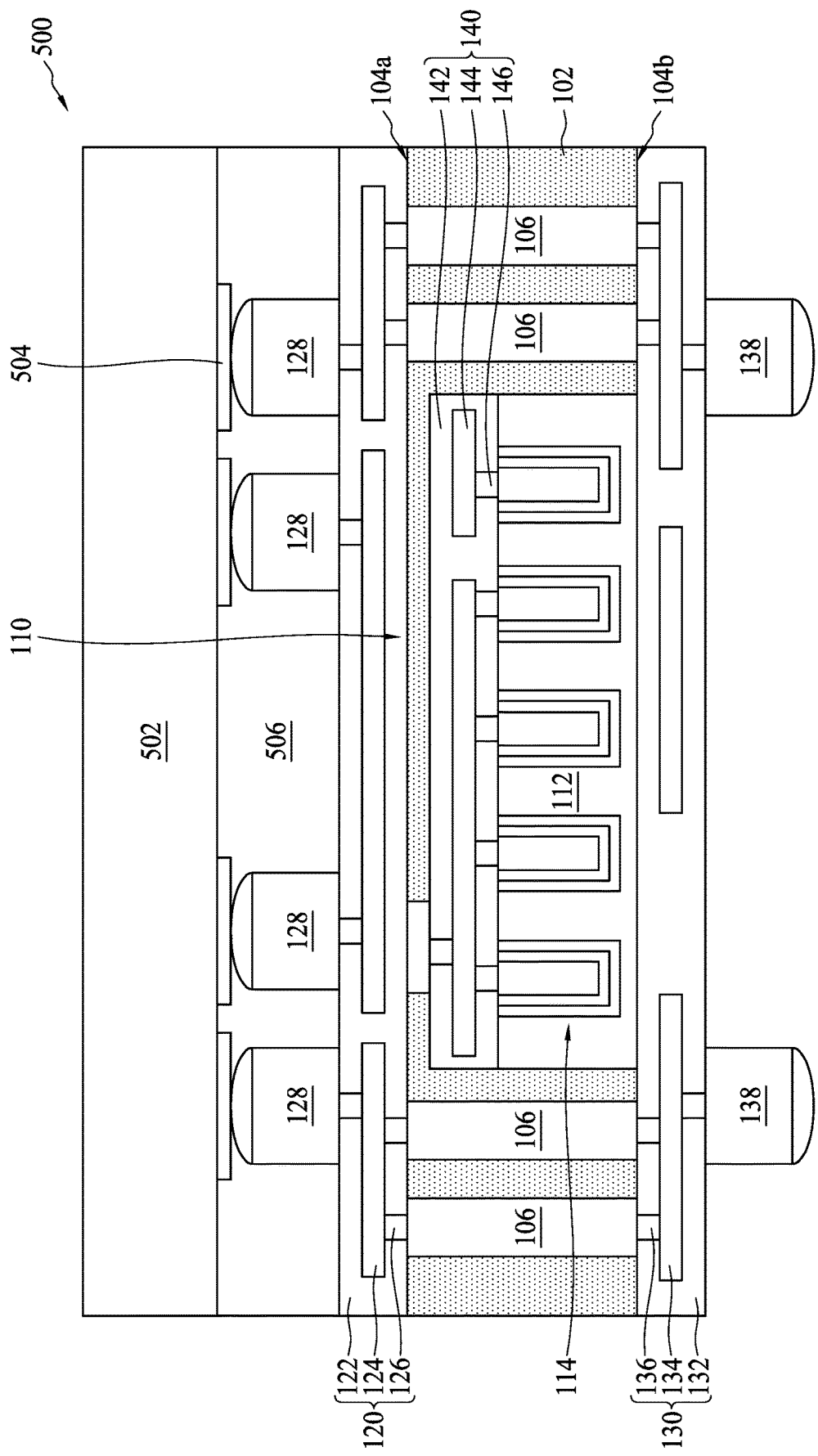
FIG. 7 is a schematic drawing illustrating a semiconductor package structure in accordance with some embodiments of the present disclosure.

FIG. 7 is a schematic drawing illustrating a semiconductor package structure in accordance with some embodiments of the present disclosure. In some embodiments, the package structure 100 can be integrated with another package structure to form, for example but not limited thereto, a fan-out package structure. In such embodiments, both of the connection structures 120 and 130 serve as fan-out routing layers, and thus the passive device component 110 provides improved compatibility for integration with all types and sizes of dies, substrates or packages. For example, the package structure 100 can be integrated with another die to form a semiconductor structure 500, as shown in FIG. 7. In some embodiments, the semiconductor package structure 500 includes a die 502, and the package structure 100 is disposed over and electrically coupled to the die 502. A connection structure (not shown) can be disposed over and electrically coupled to the die 502, and a bonding pad 504 can be disposed over and electrically coupled to the connection structure. In some embodiments, the first surface 104a (the front surface) of the package structure 100 faces the die 502, and the package structure 100 is electrically coupled to bonding pad 504 of the die 502 through the conductor 128 and the connection structure 120. However, in other embodiments, when the second surface 104b (the back surface) of the package structure 100 faces the die 502, the package structure 100 is electrically coupled to the bonding pad 504 of the die 502 through the conductor 138 and the connection structure 130. Still referring to FIG. 7, in some embodiments, an underfill 506 can be formed to fill gaps between the conductors 128, the bonding pad 504 and the die 502. In some embodiments, a diameter of the conductor 138 can be similar to a diameter of the conductor 128. In other embodiments, the diameter of the conductor 138 can be greater than the diameter of the conductor 128.

Figure 8A:
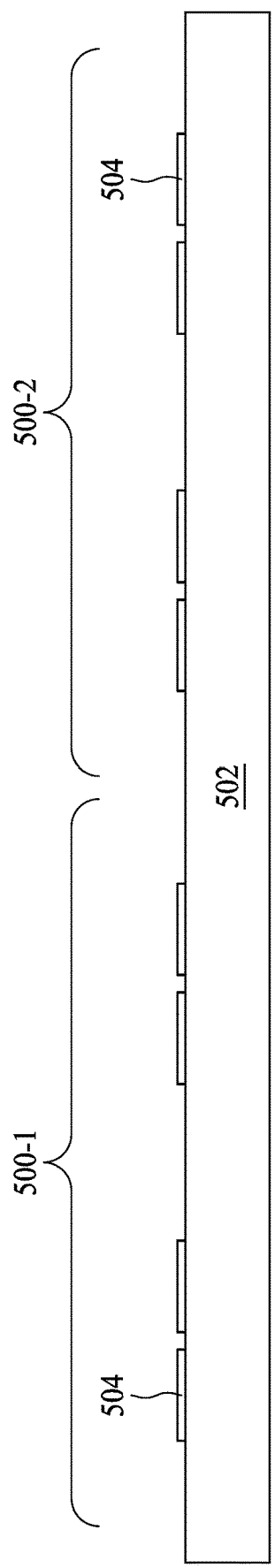
FIGS. 8A through 8D illustrate sectional views of a semiconductor package structure at various fabrication stages constructed according to aspects of the present disclosure in one or more embodiments.
Figure 8B:
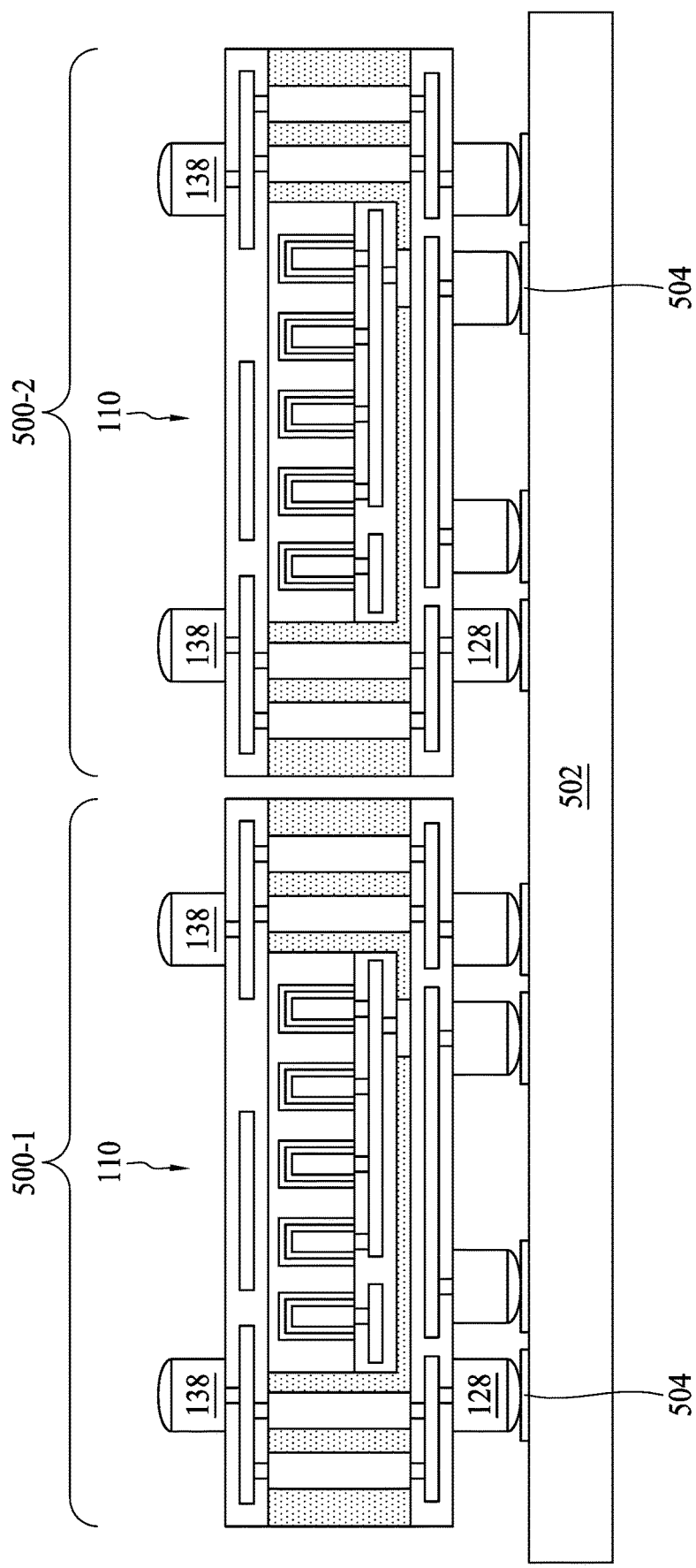
Figure 8C:
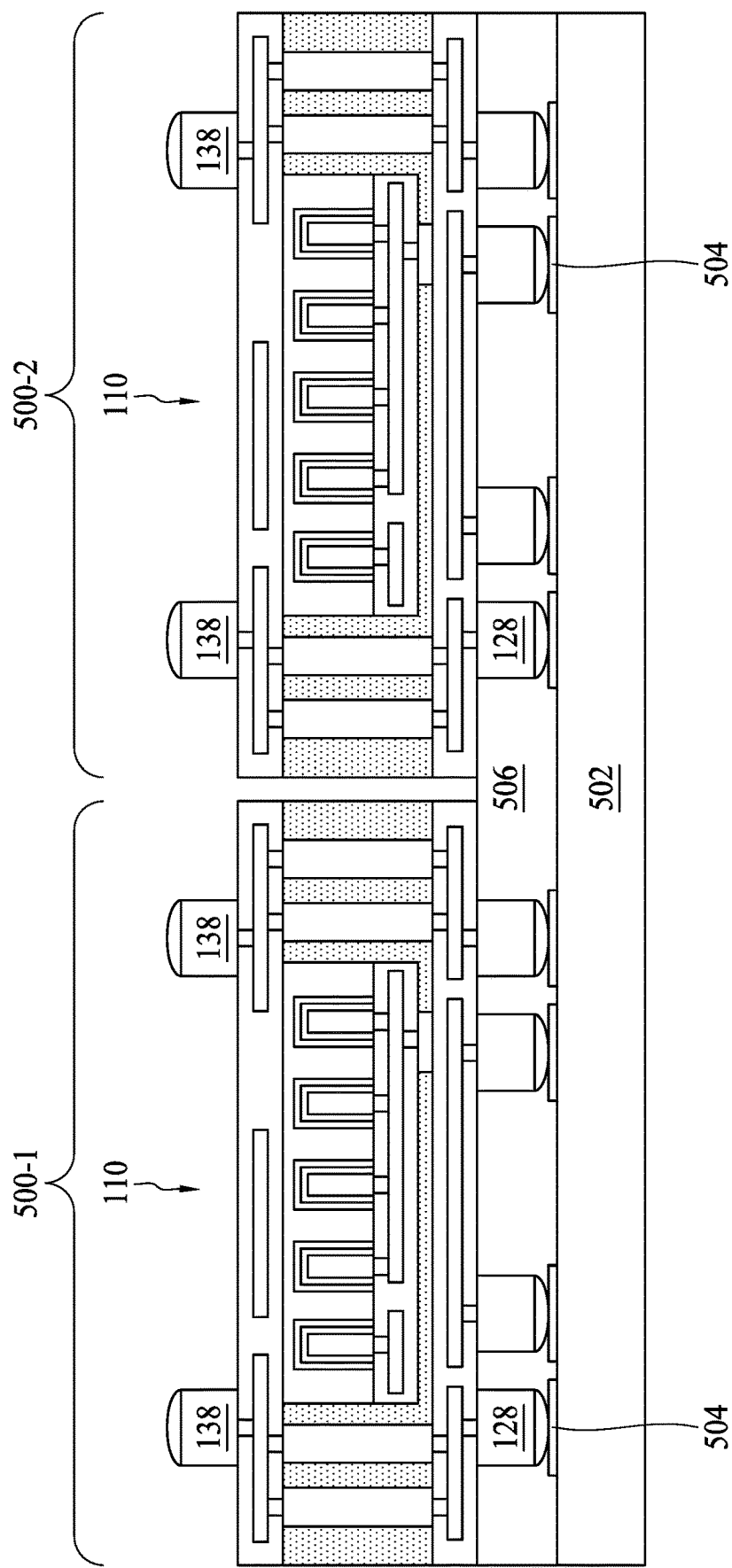
Figure 8D:
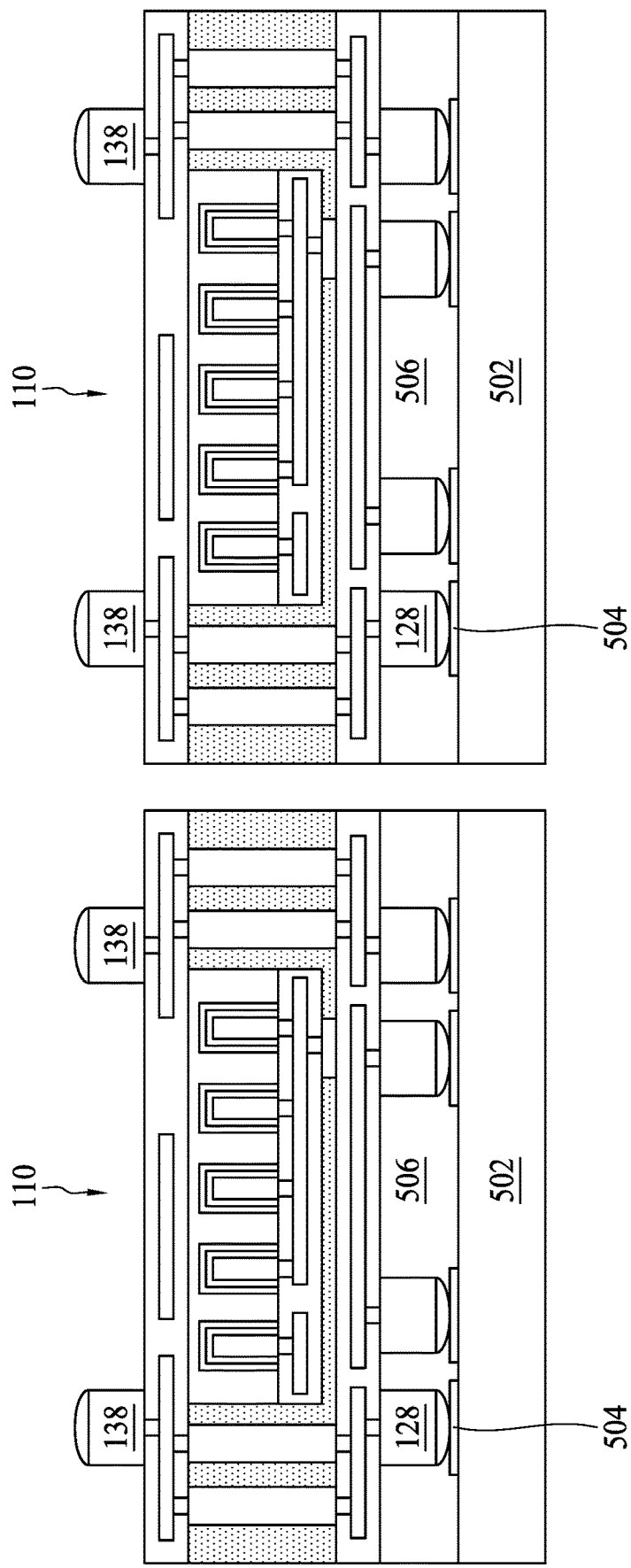

FIGS. 8A through 8D illustrate sectional views of the semiconductor package structure 500 at various fabrication stages constructed according to aspects of the present disclosure in one or more embodiments. As shown in FIG. 8A, a semiconductor substrate 502 is received or provided. In some embodiments, die regions 500-1 and 500-2 for manufacturing semiconductor package structures, respectively, can be defined over the semiconductor substrate. In some embodiments, wafer-level manufacturing operations are performed to form a plurality of active devices in each of the die regions 500-1 and 500-2 in the semiconductor substrate 502. Significantly, all available wafer area of the wafer is utilized to form the dies. In some embodiments, the die 502 can be a PMIC die, an APIC die, or a logic die, but the disclosure is not limited thereto. In some embodiments, a connection structure (not shown) can be formed over the semiconductor substrate 502 in the die regions 500-1 and 500-2, and a bonding pad 504 can be formed over the connection structure. Referring to FIG. 8B, the package structure 110 is disposed in each of the die regions 500-1 and 500-2. As shown in FIG. 8B, the conductor 128 is in contact with and electrically coupled to the bonding pad 504. Referring to FIG. 8C, an underfill 506 is formed to fill gaps between the conductors 128, the bonding pads 504 and the semiconductor substrate 502. Referring to FIG. 8D, a singulation process can be performed by dicing along scribe line regions, e.g., between adjacent die regions 500-1 and 500-2. Dicing saw or laser cutting operations may be used, in various embodiments. The singulation operation separates the die regions 500-1 and 500-2 from each other, and a plurality of semiconductor package structures 500, such as the semiconductor package structure 500 shown in FIGS. 7 and 8D, is formed. In other words, the underfill 506 and the semiconductor substrate 502 are cut and singulated to form the semiconductor package structures 500 as shown in FIGS. 7 and 8D.

In some embodiments, a semiconductor structure is provided. The semiconductor structure includes a molding compound having a first surface and a second surface opposite to the first surface, a passive device component disposed in the molding compound, a via penetrating the molding compound from the first surface to the second surface, a first connection structure disposed over the first surface of the molding compound and electrically coupled to the passive device component, and a second connection structure disposed over the second surface of the molding compound. In some embodiments, the first connection structure and the second connection structure are electrically coupled to each other by the via.

In some embodiments, a semiconductor package structure is provided. The semiconductor package structure includes a first package structure and a second package structure disposed over the first package structure. The first package structure includes a first molding compound having a first surface and a second surface opposite to the first surface, a first connection structure disposed over the first surface, a second connection structure disposed over the second surface, a first via disposed in the first molding compound and electrically coupling the first connection structure to the second connection structure, a first conductor disposed over the first connection structure, and a second conductor disposed over the second connection structure. In some embodiments, the second package structure is electrically coupled to the first package structure through the first conductor.

In some embodiments, a method for forming a semiconductor package structure is provided. The method includes receiving a carrier substrate; forming a first connection structure over the carrier substrate; forming a first via on the first connection structure; disposing a passive device component over the first connection structure; forming a first molding compound surrounding the first via and the passive device component; and forming a second connection structure over the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure comprising:
a first package structure comprising:
    a passive device component comprising a semiconductor substrate;
    a first molding compound having a first surface and a second surface opposite to the first surface;
    a first connection structure disposed over the first surface;
    a second connection structure disposed over the second surface;
    a third connection structure disposed over the semiconductor substrate of the passive device component, wherein a width of the third connection structure and a width of the semiconductor substrate are the same;
    a first via disposed in the first molding compound and electrically coupling the first connection structure to the second connection structure;
    a first conductor disposed over the first connection structure; and
    a second conductor disposed over the second connection structure;
a second package structure disposed over the first package structure, wherein the second package structure comprises:
    a first die;
    a second molding compound surrounding the first die, wherein the second molding compound has a third surface facing the first package structure and a fourth surface opposite to the third surface;
    a fourth connection structure disposed over the third surface of the second molding compound; and a third conductor disposed over the fourth connection structure and electrically coupled to the fourth connection structure;
a second via penetrating the second molding compound from the third surface to the fourth surface;
a fifth connection structure disposed over the fourth surface of the second molding compound; and
a fourth conductor disposed between the second molding compound and the fifth connection structure,
wherein the second package structure is electrically coupled to the first package structure through the first conductor, and the fifth connection structure is electrically coupled to the second via through the fourth conductor.

2. The semiconductor package structure of claim 1, wherein a diameter of the third conductor is greater than diameters of the first conductor and the second conductor.

3. The semiconductor package structure of claim 1, wherein the semiconductor substrate is in direct contact with the second connection structure.

4. The semiconductor package structure of claim 1, wherein a width of the first package structure is less than a width of the second package structure.

5. The semiconductor package structure of claim 1, wherein a width of the first connection structure, a width of the second connection structure, and a width of the first molding compound are the same.

6. The semiconductor package structure of claim 1, wherein a width of the fourth connection structure and a width of the second molding compound are the same.

7. The semiconductor package structure of claim 1, wherein a width of the fifth connection structure and a width of the second molding compound are the same.

8. A semiconductor package structure comprising:
a first package structure comprising:
a passive device component comprising a semiconductor substrate;
a first molding compound having a first surface and a second surface opposite to the first surface;
a first connection structure disposed over the first surface;
a second connection structure disposed over the second surface, wherein the semiconductor substrate is in direct contact with the second connection structure;
a third connection structure disposed over the semiconductor substrate of the passive device component, wherein a width of the third connection structure and a width of the semiconductor substrate are the same;
a via disposed in the first molding compound and electrically coupling the first connection structure to the second connection structure;
a first conductor disposed over the first connection structure; and
a second conductor disposed over the second connection structure; and
a second package structure comprising:
a die;
a second molding compound having a third surface and a fourth surface opposite to the third surface;
a fourth connection structure disposed over the third surface of the second molding compound; and
a third conductor disposed over and electrically coupled to the fourth connection structure,
wherein the second package structure is electrically coupled to the first package structure through the second conductor, and a width of the first package structure is less than a width of the second package structure.

9. The semiconductor package structure of claim 8, wherein the third surface of the second molding compound faces the first package structure.

10. The semiconductor package structure of claim 8, wherein a diameter of the third conductor is greater than diameters of the first conductor and the second conductor.

11. The semiconductor package structure of claim 8, wherein the fourth connection structure is disposed between the die and the first package structure.

12. The semiconductor package structure of claim 8, wherein the passive device component is electrically coupled to the first connection structure through the third connection structure.

13. The semiconductor package structure of claim 8, wherein a width of the fourth connection structure and a width of the second molding compound are the same.

14. The semiconductor package structure of claim 8, wherein the first package structure and the third conductor are disposed at a same level.

15. The semiconductor package structure of claim 8, wherein the second package structure is electrically connected to the first package structure through the fourth connection structure.

16. A semiconductor package structure comprising:
a first package structure comprising:
a passive device component comprising a semiconductor substrate;
a first molding compound having a first surface and a second surface opposite to the first surface;
a first connection structure disposed over the first surface;
a second connection structure disposed over the second surface;
a third connection structure disposed over the semiconductor substrate of the passive device component, wherein a width of the third connection structure and a width of the semiconductor substrate are the same;
a first via disposed in the first molding compound and electrically coupling the first connection structure to the second connection structure;
a first conductor disposed over the first connection structure; and
a second conductor disposed over the second connection structure;
a second package structure comprising:
a first die;
a second molding compound having a third surface and a fourth surface opposite to the third surface;
a fourth connection structure disposed over the third surface of the second molding compound; and
a third conductor disposed over and electrically coupled to the fourth connection structure;
a third package structure electrically coupled to the second package structure, wherein the third package structure comprises:
a second die;
a fifth connection structure disposed over the second die; and
a fourth conductor disposed over and electrically coupled to the fifth connection structure; and
a second via disposed in the second molding compound, wherein the fourth connection structure is electrically coupled to the fifth connection structure through the second via, wherein the second package structure is electrically coupled to the first package structure through the first conductor, and the third package structure is electrically coupled to the second package structure through the fourth conductor.

17. The semiconductor package structure of claim 16, wherein a height of the second via is greater than a height of the first via.

18. The semiconductor package structure of claim 16, wherein a diameter of the fourth conductor is different from diameters of the first conductor and the second conductor.

19. The semiconductor package structure of claim 16, wherein a diameter of the fourth conductor is different from a diameter of the third conductor.

20. The semiconductor package structure of claim 16, wherein the passive device component is electrically coupled to the first connection structure through the third connection structure.

* * * * *